(12) United States Patent
Park

(10) Patent No.: US 12,733,373 B2
(45) Date of Patent: Sep. 8, 2026

(54) DISPLAY DEVICE AND METHOD OF MANUFACTURING THE SAME

(71) Applicant: Samsung Display Co., LTD., Yongin-si (KR)

(72) Inventor: Doyeong Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 347 days.

(21) Appl. No.: 18/529,039

(22) Filed: Dec. 5, 2023

(65) Prior Publication Data

US 2024/0292710 A1 Aug. 29, 2024

(30) Foreign Application Priority Data

Feb. 23, 2023 (KR) ........................ 10-2023-0024664

(51) Int. Cl.
*H10K 59/80* (2023.01)
*H10K 59/12* (2023.01)
(Continued)

(52) U.S. Cl.
CPC ..... *H10K 59/8723* (2023.02); *H10K 59/1201* (2023.02); *H10K 59/121* (2023.02); *H10K 59/38* (2023.02)

(58) Field of Classification Search
CPC ........... H10K 59/8723; H10K 59/1201; H10K 59/121; H10K 59/38; H10K 59/122;
(Continued)

(56) References Cited

U.S. PATENT DOCUMENTS 11,145,700 B2 10/2021 Choi et al.
2015/0034923 A1 2/2015 Kim et al.
(Continued)

FOREIGN PATENT DOCUMENTS

JP 2021-529249 10/2021
KR 10-2015-0015647 A 2/2015
(Continued)

OTHER PUBLICATIONS

Office Action dated Jun. 30, 2026 in related Korean Patent Application No. 10-2023-0024664, 8 pages, in Korean.
(Continued)

*Primary Examiner* — Yasser A Abdelaziez
(74) *Attorney, Agent, or Firm* — F. CHAU & ASSOCIATES, LLC

(57) ABSTRACT

A display device includes a substrate including a first deposition region, a second deposition region adjacent to the first deposition region in a first direction, and an overlapping region between the first and second deposition regions, a first vertical separator disposed on the first deposition region and extending in a second direction intersecting the first direction, a first common layer disposed on the first deposition region and disconnected by the first vertical separator, a second common layer disposed on the second deposition region and disconnected from the first common layer in the overlapping region, and a common electrode disposed on the first and second common layers and connected in the overlapping region.

20 Claims, 35 Drawing Sheets

(51) Int. Cl.
*H10K 59/121* (2023.01)
*H10K 59/38* (2023.01)

(58) Field of Classification Search
CPC .... H10K 59/35; H10K 59/353; H10K 71/166; H10K 59/12; H10K 71/60; H10K 50/13; H10K 50/15; H10K 50/16; H10K 59/80515; H10K 59/80521; H10K 77/10
See application file for complete search history.

(56) References Cited

U.S. PATENT DOCUMENTS

2021/0408163 A1* 12/2021 Heo ..................... H10K 59/353
2022/0238835 A1* 7/2022 Takahashi ........ H10K 59/80515
2023/0371314 A1* 11/2023 Ishida .................. H10K 59/122

FOREIGN PATENT DOCUMENTS

KR 10-2016-0072010 A 6/2016
KR 10-2020-0143623 12/2020
KR 10-2021-0037950 4/2021
KR 10-2022-0107626 8/2022

OTHER PUBLICATIONS

Office Action dated Jun. 30, 2026 in related Korean Patent Application No. 10-2023-0024664, 9 pages, English Translation.

* cited by examiner

VIA
I'
I
CL2 UETL2 CE
PE5
UETL2
CL2 CE
VS2
DA2
CL2 UETL2 CE
PE4
OA
CL1 UETL1 CE
PE2
UETL1
CL1 CE
VS1
PDL
DA1
CL1 UETL1 CE
PE1
D3
D2
D1

VIA
I'
PE5
VS2
DA2
PE4
OA
CL1
CL1
CL1
PE2
VS1
PDL
DA1
PE1
I
D3
D2
D1

VIA
I'
PE5
VS2
DA2
PE4
OA
CL1 UETL1
PE2
UETL1
CL1
VS1
PDL
DA1
CL1 UETL1
PE1
I
D3
D1
D2

VIA
I'
I
CL2
CL2
CL2
PE5
VS2
DA2
PE4
OA
CL1 UETL1
CL1
PE2
UETL1
CL1
VS1
PDL
DA1
CL1 UETL1
PE1
D3
D1
D2

VIA
II'
PE5
VS2
DA2
PE4
OA
CL1
CL1
CL1
PE2
VS1
PDL
DA1
PE1
II
D3
D2
D1

VIA
II'
CL2
CL2
CL2
PE5
VS2
PE4
DA2
OA
CL1 UETL1
CL1 UETL1
UETL1
CL1
PE2
VS1
PDL
PE1
DA1
II
D3
D2
D1

FIG. 35

VIA
II'
CL2 UETL2 CE
UETL2
CL2 CE
CL1 UETL1 CE
UETL1
CL1 CE
PE5
VS2
PE4
PE2
VS1
PDL
PE1
DA2
OA
DA1
II
D3
D2
D1

DISPLAY DEVICE AND METHOD OF MANUFACTURING THE SAME

This application claims priority to and benefits of Korean Patent Application No. 10-2023-0024664 under 35 U.S.C. § 119, filed on Feb. 23, 2023, in the Korean Intellectual Property Office (KIPO), the entire content of which are incorporated herein by reference.

BACKGROUND

1. Technical Field

The disclosure relates generally to a display device.

2. Description of the Related Art

A display device is a device that displays images, and examples of the display device include an organic light emitting display device and a liquid crystal display device. An organic light emitting display device includes an organic emission layer interposed between a pixel electrode and a common electrode. When the two electrodes inject electrons and holes into the organic emission layer, light is emitted by combination of electrons and holes.

The organic light emitting diode display includes red, green, and blue sub-pixels, and an organic emission layer emitting light is formed in each sub-pixels. In order to improve the light emitting efficiency of the organic emission layer, at least one common layer (e.g., a hole transport layer, an electron transport layer, etc.) is further formed on and/or below the organic emission layer.

The common layer is continuously deposited on the sub-pixels. However, a problem in which current leaks to the side through the common layer that is planarly continuous has been observed.

SUMMARY

Embodiments provide a display device.

Embodiments provide a method of manufacturing the display device.

A display device according to an embodiment may include a substrate including a first deposition region, a second deposition region adjacent to the first deposition region in a first direction, and an overlapping region disposed between the first deposition region and the second deposition region, a first vertical separator disposed on the first deposition region of the substrate and extending in a second direction intersecting the first direction, a first common layer disposed on the first deposition region of the substrate and disconnected by the first vertical separator, a second common layer disposed on the second deposition region of the substrate and disconnected from the first common layer in the overlapping region, and a common electrode disposed on the first common layer and the second common layer and connected in the overlapping region.

In an embodiment, the display device may further include a first upper electron transport layer disposed on the first common layer and extending to the overlapping region and a second upper electron transport layer disposed on the second common layer, extending to the overlapping region, and contacting the first upper electron transport layer in the overlapping region.

In an embodiment, the first common layer may include a first hole transport layer, a blue emission layer disposed on the first hole transport layer, a first electron transport layer disposed on the blue emission layer, a first charge generation layer disposed on the first electron transport layer, a second hole transport layer disposed on the first charge generation layer, a red emission layer disposed on the second hole transport layer, a second charge generation layer disposed on the red emission layer, a third hole transport layer disposed on the second charge generation layer, and a green emission layer disposed on the third hole transport layer.

In an embodiment, a first pixel and a second pixel adjacent to the first pixel in the second direction may be disposed in the first deposition region, and the first pixel may include a first pixel electrode, a second pixel electrode adjacent to the first pixel electrode in the first direction with the first vertical separator interposed between the first pixel electrode and the second pixel electrode, and a third pixel electrode adjacent to the first pixel electrode in the second direction.

In an embodiment, the display device may further include a first horizontal separator disposed between the first pixel and the second pixel, and extending in the first direction and a second horizontal separator disposed between the first pixel electrode and the third pixel electrode, and extending in the first direction.

In an embodiment, no separator may be disposed in the overlapping region.

In an embodiment, a first pixel, a second pixel adjacent to the first pixel in the second direction, a third pixel adjacent to the second pixel in the second direction, and a fourth pixel adjacent to the third pixel in the second direction may be disposed in the first deposition region.

In an embodiment, the display device may further include horizontal separators disposed between the first to fourth pixels and extending in the first direction.

In an embodiment, a method of manufacturing a display device according to an embodiment may include forming a first vertical separator on a first deposition region of a substrate, the substrate including the first deposition region, a second deposition region adjacent to the first deposition region in a first direction, and an overlapping region disposed between the first deposition region and the second deposition region, forming a first common layer on the first deposition region of the substrate, the first common layer disconnected by the first vertical separator, forming a second common layer on the second deposition region of the substrate, the second common layer disconnected from the first common layer in the overlapping region, and forming a common electrode on the first common layer and the second common layer, the common electrode connected in the overlapping region.

In an embodiment, the method may further include forming a first upper electron transport layer on the first common layer extending to the overlapping region and forming a second upper electron transport layer on the second common layer extending to the overlapping region. The second upper electron transport layer may contact the first upper electron transport layer in the overlapping region.

In an embodiment, the first common layer, the first upper electron transport layer, the second common layer, and the second upper electron transport layer may be sequentially formed.

In an embodiment, the first common layer may be formed through a first fine metal mask, and the first upper electron transport layer may be formed through a second fine metal mask.

In an embodiment, a width of an open portion of the second fine metal mask may be greater than a width of an open portion of the first fine metal mask by twice of a width of the overlapping region, in the first direction.

In an embodiment, the second common layer may be formed through a third fine metal mask, and the second upper electron transport layer may be formed through a fourth fine metal mask.

In an embodiment, an area of an open portion of the third fine metal mask and an area of an open portion of the first fine metal mask may be substantially same in a plan view, and an area of an open portion of the fourth fine metal mask and an area of an open portion of the second fine metal mask may be substantially same in a plan view.

In an embodiment, the second fine metal mask and the fourth fine metal mask may be loaded such that the open portion of the second fine metal mask and an open portion of the fourth fine metal mask overlap each other in the overlapping region in a plan view.

In an embodiment, the common electrode may be formed through an open mask.

In an embodiment, the method may further include forming a first pixel in the first deposition region by forming a first pixel electrode, a second pixel electrode adjacent to the first pixel electrode in the first direction with the first vertical separator interposed between the first pixel electrode and the second pixel electrode, and a third pixel electrode adjacent to the first pixel electrode in a second direction intersecting the first direction, and forming a second pixel adjacent to the first pixel in the second direction in the first deposition region.

In an embodiment, the method may further include forming a first horizontal separator between the first pixel and the second pixel; and forming a second horizontal separator between the first pixel electrode and the third pixel electrode.

In an embodiment, no separator may be formed in the overlapping region.

Therefore, the display device according to an embodiment of the disclosure may be partitioned into a first deposition region, a second deposition region, and an overlapping region. First and second pixels may be disposed in the first deposition region, and third and fourth pixels may be disposed in the second deposition region. A vertical separator may be formed in each of the first and third pixels, and each of the first and third pixels may include a common layer, an upper electron transport layer, and a common electrode. For example, a first vertical separator may be formed in the first pixel, and the first pixel may include a first common layer, a first upper electron transport layer, and a common electrode. A second vertical separation layer may be formed in the third pixel, and the third pixel may include a second common layer, a second upper electron transport layer, and the common electrode.

The first common layer may be disconnected by the first vertical separator in the first deposition region. The second common layer may be disconnected by the second vertical separator in the second deposition region. In addition, the second common layer may be disconnected from the first common layer in the overlapping region. Accordingly, the current applied from the first pixel electrode of the first pixel to the first common layer may not leak to the first common layer disposed on the second pixel electrode of the first pixel. In addition, the current applied to the second pixel electrode may not leak into the second common layer disposed on the fourth pixel electrode of the third pixel.

Even in case that an alignment error occurs in the process of manufacturing the first common layer or the second common layer, the first and second common layers may be covered by the first and second upper electron transport layers, respectively, and the first and second common layers may not contact each other. As the first and second common layers (e.g., a hole transport layer or a charge generating layer), which are main paths of leakage current, are covered by the first and second upper electron transport layers, the first and second common layers may not contact each other even if an alignment error occurs.

A separator may not be formed in the overlapping region of the display device. Accordingly, the first upper electron transport layer and the second upper electron transport layer may contact each other without being disconnected from each other in the overlapping region. Accordingly, the first upper electron transport layer and the second upper electron transport layer may be electrically connected to each other.

The common electrode may be connected through the overlapping region without being disconnected from the overlapping region. Accordingly, the common electrodes may be electrically connected to each other. Accordingly, an IR drop phenomenon of the common electrode may be prevented.

BRIEF DESCRIPTION OF THE DRAWINGS

The accompanying drawings, which are included to provide a further understanding of the disclosure are incorporated in and constitute a part of this specification, illustrate embodiments of the disclosure together with the description.

FIGS. 24 to 36 are schematic diagrams illustrating a method of manufacturing the display device of FIG. 23.

DETAILED DESCRIPTION OF THE EMBODIMENTS

Figure 1:
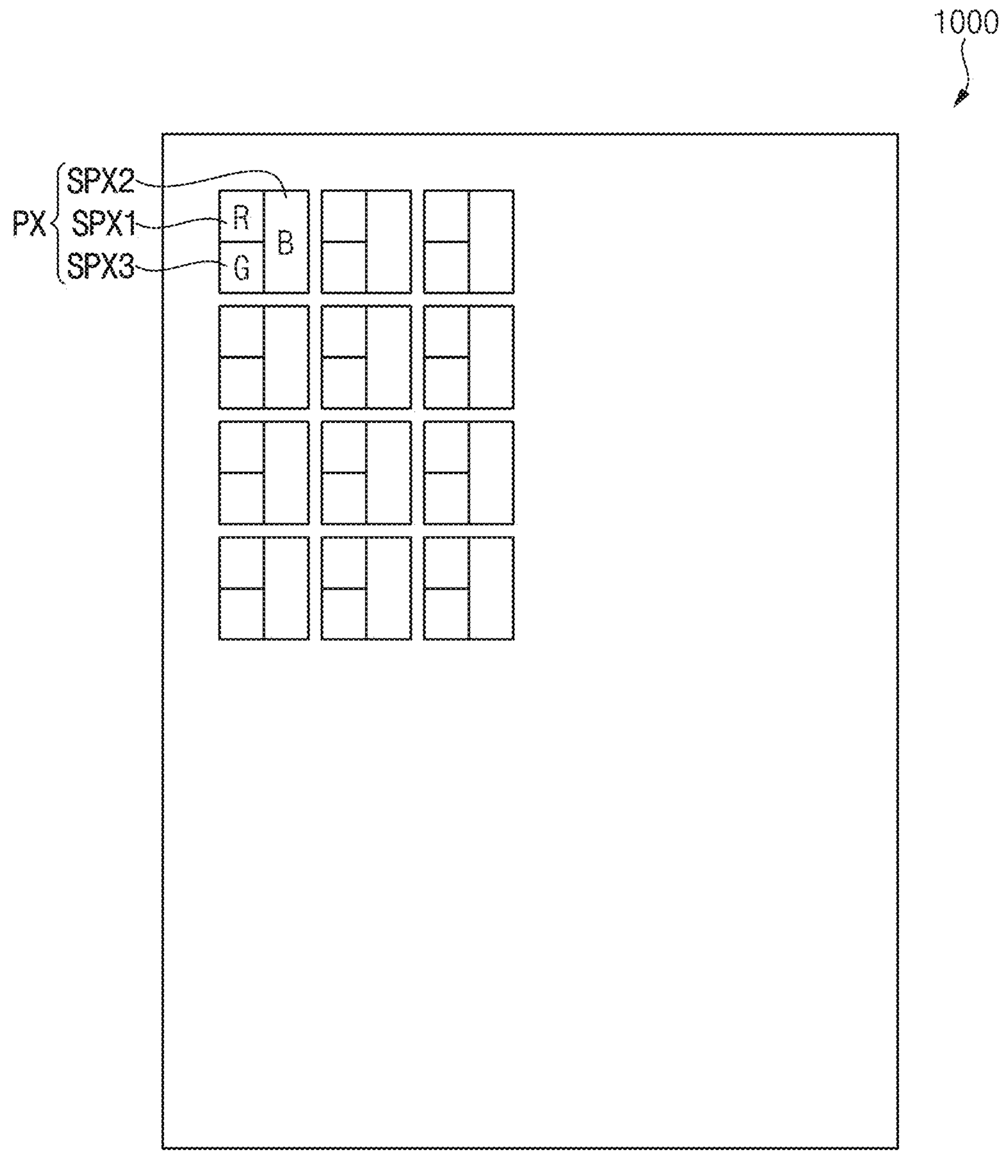
FIG. 1 is a plan view illustrating a display device according to an embodiment of the disclosure.
Figure 1:
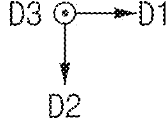

Illustrative, non-limiting embodiments will be more clearly understood from the following detailed description in conjunction with the accompanying drawings.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being “on,” “connected to,” or “coupled to” another element or layer, it may be directly on, connected to, or coupled to the other element or layer or intervening elements or layers may be present. When, however, an element or layer is referred to as being “directly on,” “directly connected to,” or “directly coupled to” another element or layer, there are no intervening elements or layers present. To this end, the term “connected” may refer to physical, electrical, and/or fluid connection, with or without intervening elements. Also, when an element is referred to as being “in contact” or “contacted” or the like to another element, the element may be in “electrical contact” or in “physical contact” with another element; or in “indirect contact” or in “direct contact” with another element.

For the purposes of this disclosure, “at least one of A and B” may be construed as A only, B only, or any combination of A and B. Also, “at least one of X, Y, and Z” and “at least one selected from the group consisting of X, Y, and Z” may be construed as X only, Y only, Z only, or any combination of two or more of X, Y, and Z. As used herein, the term “and/or” includes any and all combinations of one or more of the associated listed items.

Although the terms “first,” “second,” etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as “beneath,” “below,” “under,” “lower,” “above,” “upper,” “over,” “higher,” “side” (e.g., as in “sidewall”), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as “below” or “beneath” other elements or features would then be oriented “above” the other elements or features. Thus, the exemplary term “below” can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, “a,” “an,” and “the” are intended to include the plural forms as well, unless the context clearly indicates otherwise. Moreover, the terms “comprises,” “comprising,” “includes,” and/or “including,” when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms “substantially,” “about,” and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
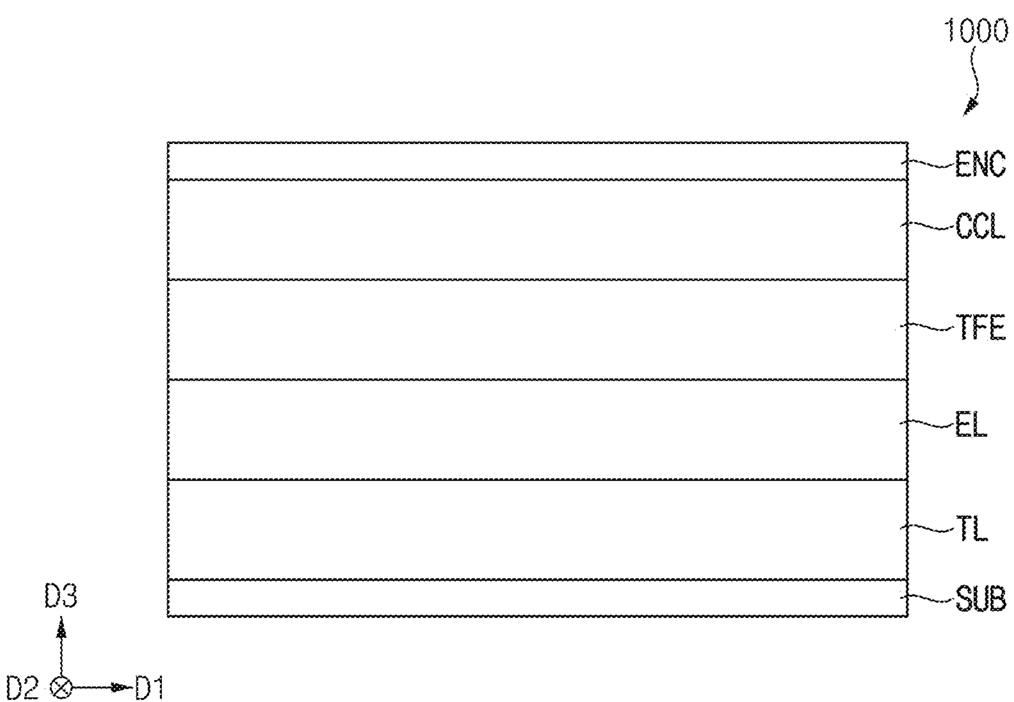
FIG. 2 is a schematic cross-sectional view illustrating the display device of FIG. 1.

FIG. 1 is a plan view illustrating a display device according to an embodiment of the disclosure. FIG. 2 is a schematic cross-sectional view illustrating the display device of FIG. 1.

Referring to FIG. 1, a display device 1000 according to an embodiment of the disclosure may include at least one pixel, and the pixel may include at least one sub-pixel. For example, the display device 1000 may include multiple pixels PX, and each of the pixels PX may include a first sub-pixel SPX1, a second sub-pixel SPX2, and a third sub-pixel SPX3. Each of the pixels PX may have the substantially same structure and may be arranged in a matrix pattern in a first direction D1 and a second direction D2 intersecting the first direction D1.

In an embodiment, the first sub-pixel SPX1 may emit red light, the second sub-pixel SPX2 may emit blue light, and the third sub-pixel SPX3 may emit green light. Each of the pixels PX may emit light of a color obtained by combining colors emitted from the first to third sub-pixels SPX1, SPX2, and SPX3, and the display device 1000 may display an image in which colors emitted from the pixels PX are combined.

Referring to FIG. 2, the display device 1000 may include a substrate SUB, a transistor layer TL, an emission layer EL, a thin film encapsulation layer TFE, a color conversion layer CCL, and a glass encapsulation layer ENC. The transistor layer TL, the emission layer EL, the thin film encapsulation layer TFE, the color conversion layer CCL, and the glass encapsulation layer ENC may be sequentially stacked on the substrate SUB.

The transistor layer TL may generate a driving current, and the emission layer EL may emit light corresponding to the driving current. The thin film encapsulation layer TFE may prevent penetration of moisture and outside air into the emission layer EL. The color conversion layer CCL may convert the color of light emitted from the emission layer EL, and the glass encapsulation layer ENC may protect the emission layer EL and the color conversion layer CCL from impact.

Figure 3:
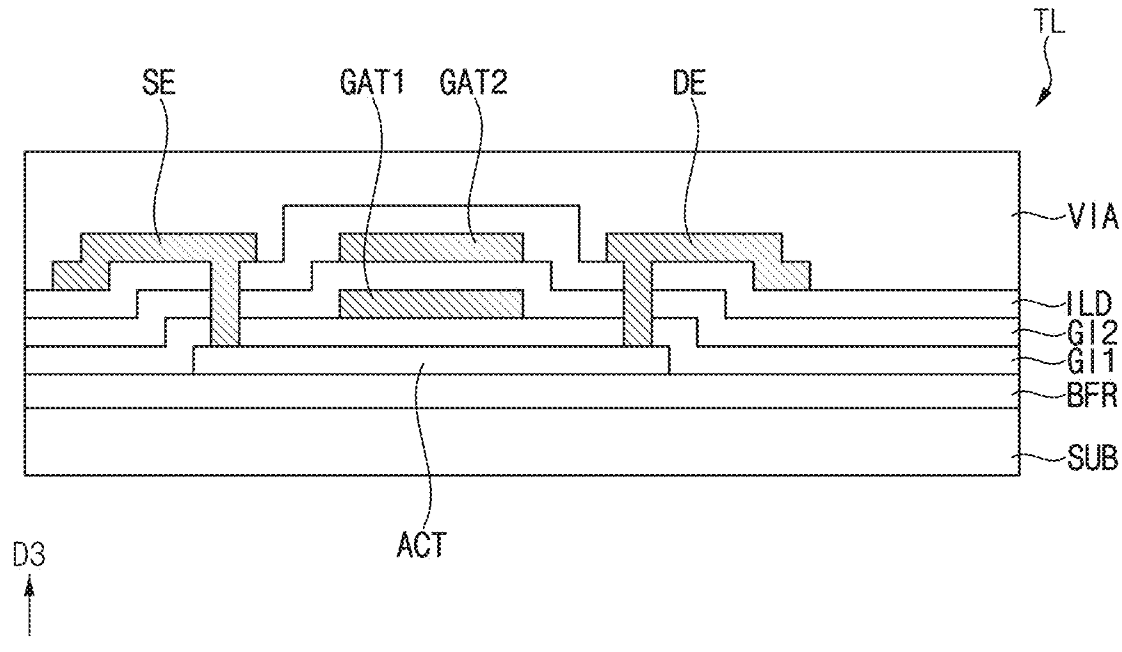
FIG. 3 is a schematic cross-sectional view illustrating a transistor layer included in the display device of FIG. 2.
Figure 4:
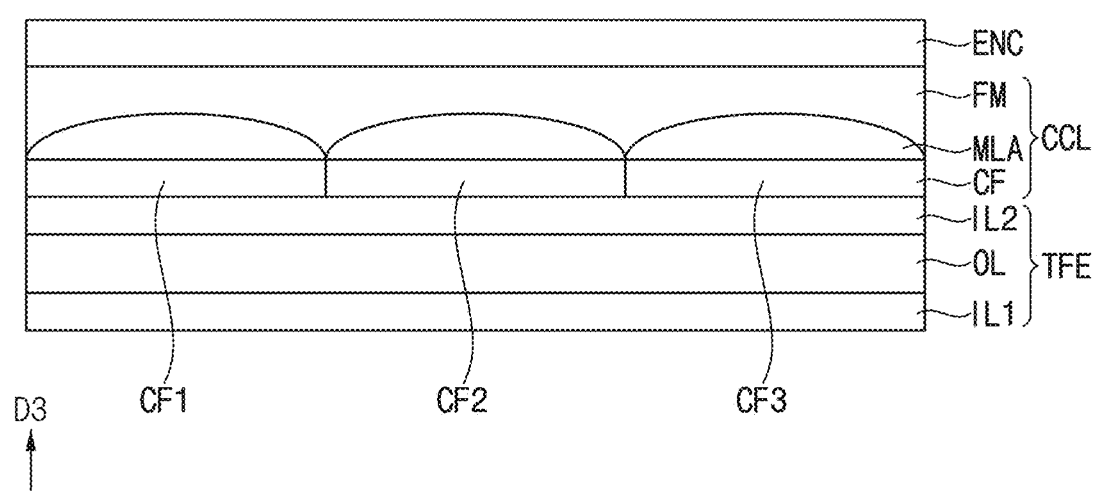
FIG. 4 is a schematic cross-sectional view illustrating a thin film encapsulation layer, a color conversion layer, and a glass encapsulation layer included in the display device of FIG. 2.

FIG. 3 is a schematic cross-sectional view illustrating a transistor layer included in the display device of FIG. 2. FIG. 4 is a schematic cross-sectional view illustrating a thin film encapsulation layer, a color conversion layer, and a glass encapsulation layer included in the display device of FIG. 2.

Referring to FIG. 3, the transistor layer TL may include a buffer layer BFR, an active pattern ACT, a first gate insulating layer GI1, a first gate electrode GAT1, a second gate insulating layer GI2, a second gate electrode GAT2, an interlayer insulating layer ILD, a source electrode SE, a drain electrode DE, and a via insulating layer VIA.

In an embodiment, the substrate SUB may include glass, quartz, plastic, or the like. For example, the substrate SUB may include a plastic such as polyimide (PI), polyacrylate, polymethylmethacrylate (PMMA), polycarbonate (PC), polyethylenenaphthalate (PEN), polyvinylidene chloride, polyvinylidene difluoride (PVDF), polystyrene, ethylene-vinyl alcohol copolymer, polyethersulphone (PES), poly etherimide (PEI), polyphenylene sulfide (PPS), polyallylate, tri-acetyl cellulose (TAC), cellulose acetate propionate (CAP), and the like. These may be used alone or in combination with each other.

The buffer layer BFR may be disposed on the substrate SUB. In an embodiment, the buffer layer BFR may be formed of an inorganic material. For example, the buffer layer BFR may include an inorganic material such as silicon oxide, silicon nitride, and silicon oxynitride. These may be used alone or in combination with each other. The buffer layer BFR may prevent metal atoms or impurities from penetrating into the active pattern ACT. The buffer layer BFR may control a heat supply rate during a crystallization process for forming the active pattern ACT.

The active pattern ACT may be disposed on the buffer layer BFR. In an embodiment, the active pattern ACT may be formed of a silicon semiconductor material or an oxide semiconductor material. For example, the active pattern ACT may include a silicon semiconductor such as amorphous silicon and polycrystalline silicon. For example, the active pattern ACT may include an oxide semiconductor such as InGaZnO (IGZO) and InSnZnO (ITZO). The oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The first gate insulating layer GI1 may be disposed on the buffer layer BFR and may cover the active pattern ACT. In an embodiment, the first gate insulating layer GI1 may be formed of an insulating material. For example, the first gate insulating layer GI1 may include an insulating material such as silicon oxide, silicon nitride, and silicon oxynitride. These may be used alone or in combination with each other.

The first gate electrode GAT1 may be disposed on the first gate insulating layer GI1. In an embodiment, the first gate electrode GAT1 may include a metal, an alloy, a conductive metal oxide, a transparent conductive material, or the like. For example, the first gate electrode GAT1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The second gate insulating layer GI2 may be disposed on the first gate insulating layer GI1 and may cover the first gate electrode GAT1. In an embodiment, the second gate insulating layer GI2 may include an insulating material.

The second gate electrode GAT2 may be disposed on the second gate insulating layer GI2. In an embodiment, the second gate electrode GAT2 may include a metal, an alloy, a conductive metal oxide, a transparent conductive material, or the like.

The interlayer insulating layer ILD may be disposed on the second gate insulating layer GI2 and may cover the second gate electrode GAT2. In an embodiment, the interlayer insulating layer ILD may include an insulating material.

The source electrode SE and the drain electrode DE may be disposed on the interlayer insulating layer ILD. In an embodiment, the source electrode SE and the drain electrode DE may contact the active pattern ACT. The source electrode SE and the drain electrode DE may include a metal, an alloy, a conductive metal oxide, a transparent conductive material, or the like.

The via insulating layer VIA may be disposed on the interlayer insulating layer ILD and may cover the source electrode SE and the drain electrode DE. In an embodiment, the via insulation layer VIA may include an organic material. For example, the via insulation layer VIA may include a photoresist, a polyacrylic resin, a polyimide resin, or an acrylic resin. These may be used alone or in combination with each other. Accordingly, the via insulation layer VIA may have a substantially flat upper surface.

Referring to FIG. 4, the thin film encapsulation layer TFE may include a first inorganic layer IL1, an organic layer OL, and a second inorganic layer IL2. The color conversion layer CCL may include a color filter layer CF, a micro lens array MLA, and a filler FM.

The first inorganic layer IL1 may be disposed on the via insulating layer VIA. In an embodiment, the first inorganic layer IL1 may include an inorganic material. For example, the first inorganic layer IL1 may include an inorganic material such as silicon oxide, silicon nitride, and silicon oxynitride. These may be used alone or in combination with each other.

The organic layer OL may be disposed on the first inorganic layer IL1. In an embodiment, the organic layer OL may include an organic material. For example, the organic layer OL may include an organic material such as a photoresist, a polyacrylic resin, a polyimide resin, and an acrylic resin. These may be used alone or in combination with each other.

The second inorganic layer IL2 may be disposed on the organic layer OL. The second inorganic layer IL2 and the first inorganic layer IL1 may include substantially a same material.

The color filter layer CF may include a first color filter CF1, a second color filter CF2, and a third color filter CF3. The first color filter CF1 may convert the color of light emitted from the emission layer EL into red, the second color filter CF2 may convert the color of light emitted from the emission layer EL into blue, and the third color filter CF3 may convert the color of the light emitted from the emission layer EL to green. For example, the first color filter CF1 may correspond to the first sub-pixel SPX1, the second color filter CF2 may correspond to the second sub-pixel SPX2, and the third color filter CF3 may correspond to the third sub-pixel SPX3.

The micro lens array MLA may include multiple micro lenses. The micro lens array MLA may create a virtual image from images provided from the emission layer EL and the color filter layer CF, and may project the virtual image onto the user's eyes.

The filler FM may protect the color filter layer CF and the micro lens array MLA from impact and may include a liquid polymer.

The glass encapsulation layer ENC may include glass and may protect lower elements from impact.

Figure 5:
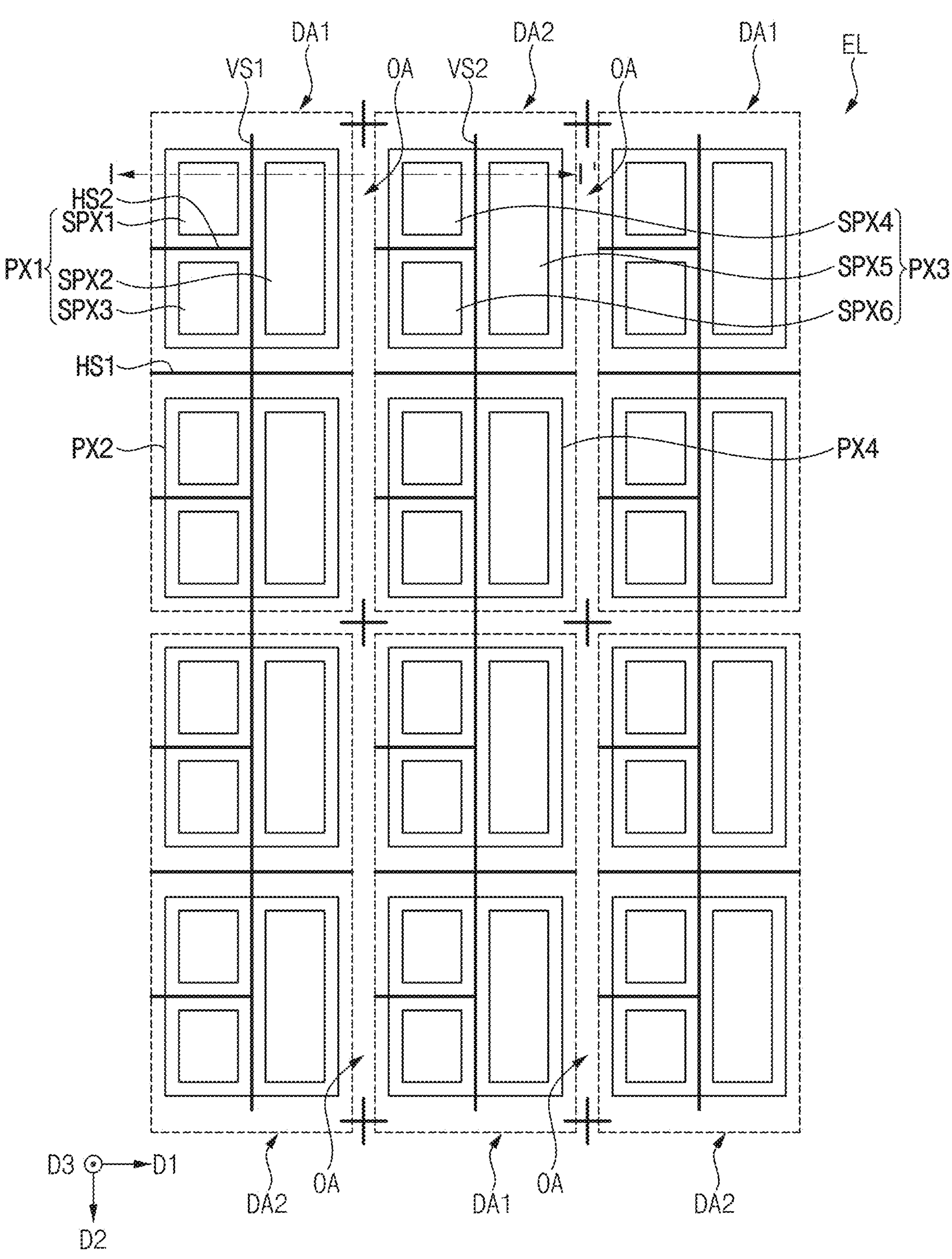
FIG. 5 is a plan view illustrating an emission layer included in the display device of FIG. 2.
Figure 6:
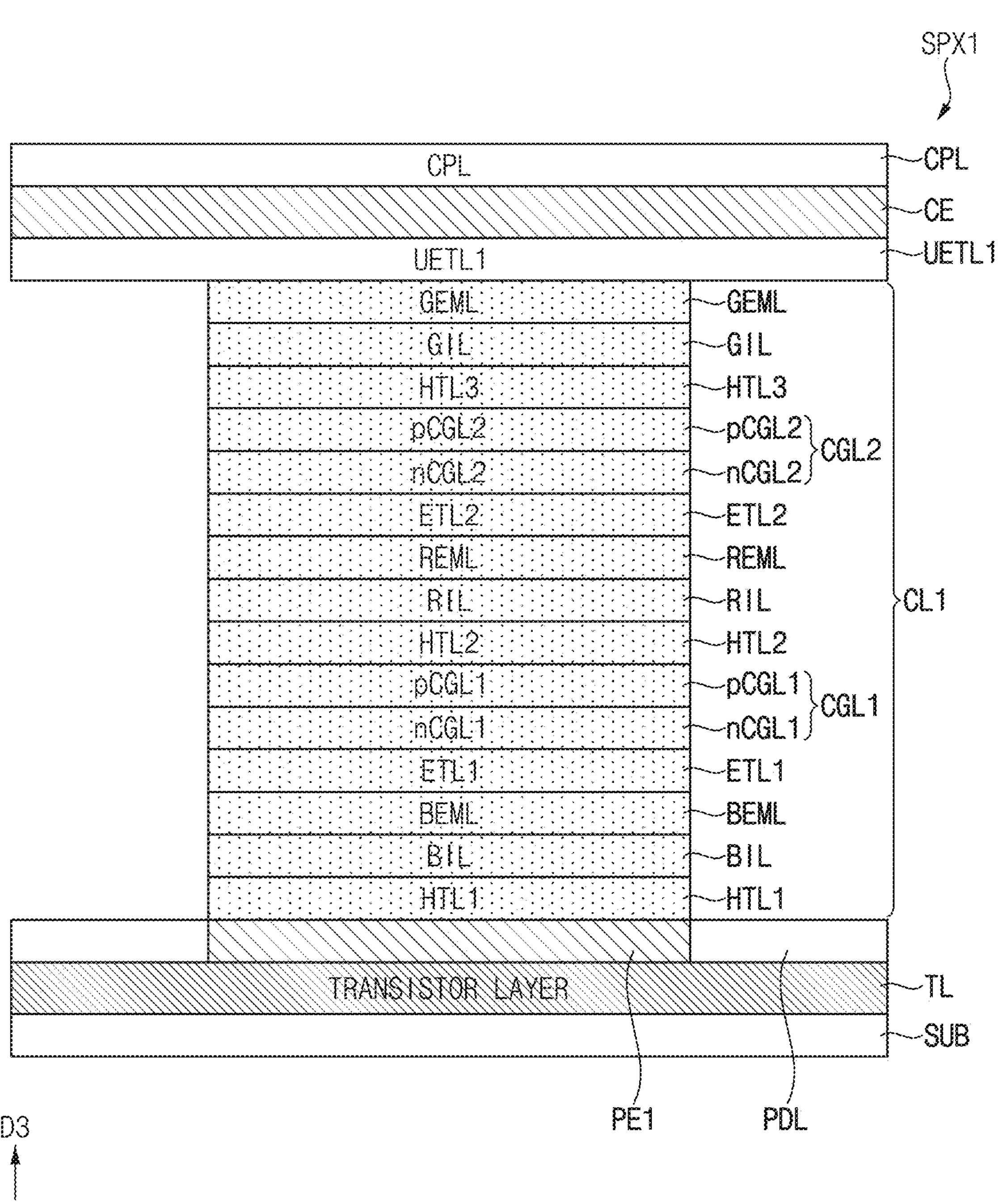
FIG. 6 is a schematic cross-sectional view illustrating a first sub-pixel included in the emission layer of FIG. 5.
Figure 7:
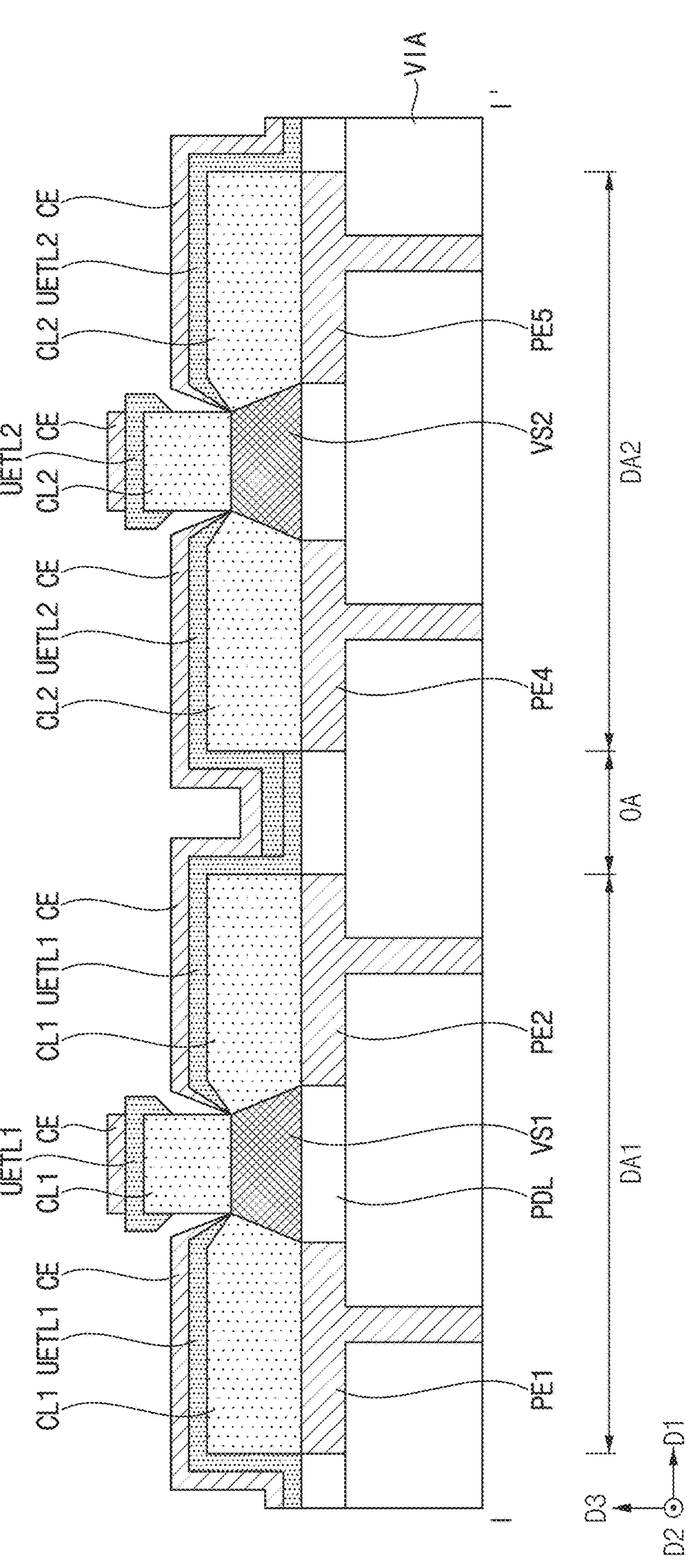
FIG. 7 is a schematic cross-sectional view taken along line I-I' of FIG. 5.

FIG. 5 is a plan view illustrating an emission layer included in the display device of FIG. 2. FIG. 6 is a schematic cross-sectional view illustrating a first sub-pixel included in the emission layer of FIG. 5. FIG. 7 is a schematic cross-sectional view taken along line I-I' of FIG. 5.

Referring to FIG. 5, multiple deposition regions and multiple overlapping regions may be defined in the emission layer EL. For example, a first deposition region DA1 and a second deposition region DA2 may be defined in the emission layer EL. The first deposition region DA1 and the second deposition region DA2 may be adjacent to each other, may be alternately arranged in the first direction D1 and the second direction D2. The overlapping region OA may be positioned between the first deposition region DA1 and the second deposition region DA2.

Multiple pixels may be disposed in the first deposition region DA1. For example, as shown in FIG. 5, a first pixel PX1 and a second pixel PX2 may be disposed in the first deposition region DA1. The second pixel PX2 may be disposed adjacent to the first pixel PX1 in the second direction D2.

Multiple pixels may be disposed in the second deposition region DA2. For example, as shown in FIG. 5, a third pixel PX3 and a fourth pixel PX4 may be disposed in the second deposition region DA2. The third pixel PX3 may be disposed adjacent to the first pixel PX1 in the first direction D1, and the fourth pixel PX4 may be disposed adjacent to the third pixel PX3 in the second direction D2. The first to fourth pixels PX1 to PX4 may have a substantially same structure. For example, the third pixel PX3 may include a fourth sub-pixel SPX4, a fifth sub-pixel SPX5, and a sixth sub-pixel SPX6.

Referring to FIG. 6, the first sub-pixel SPX1 may include a first pixel electrode PE1, a first common layer CL1, a first upper electron transport layer UETL1, a common electrode CE, and a capping layer CPL.

The first common layer CL1 may be formed in all of the sub-pixels (e.g., the first to sixth sub-pixels SPX1, SPX2, SPX3, SPX4, SPX5, and SPX6). The first common layer CL1 may include a first hole transport layer HTL1, a blue auxiliary layer BIL, a blue emission layer BEML, a first electron transport layer ETL1, a first charge generation layer CGL1, a second hole transport layer HTL2, a red auxiliary layer RIL, a red emission layer REML, a second electron transport layer ETL2, a second charge generation layer CGL2, a third hole transport layer HTL3, a green auxiliary layer GIL, and a green emission layer GEML. The first charge generation layer CGL1 may include a first n-type charge generation layer nCGL1 and a first p-type charge generation layer pCGL1, and the second charge generation layer CGL2 may include a second n-type charge generation layer nCGL2 and a second p-type charge generation layer pCGL2.

The first pixel electrode PE1 may be disposed on the transistor layer TL. In an embodiment, the first pixel electrode PE1 may be electrically connected to the transistor layer TL. The first pixel electrode PE1 may include a metal, an alloy, a metal oxide, a reflective conductive material, or the like. For example, the first pixel electrode PE1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The first hole transport layer HTL1 may be disposed on the first pixel electrode PE1. The first hole transport layer HTL1 may increase hole mobility. In an embodiment, the first hole transport layer HTL1 may include a hole transport material. For example, the first hole transport layer HTL1 may include HATCN (1,4,5,8,9,11-hexaazatriphenylene-hexanitrile), CuPc (cupper phthalocyanine), PEDOT (poly (3,4)-ethylenedioxythiophene), PANI (polyaniline), or NPD (N,N-dinaphthyl-N,N'-diphenylbenzidine). These may be used alone or in combination with each other.

The blue auxiliary layer BIL may be disposed on the first hole transport layer HTL1. The blue auxiliary layer BIL may enhance resonance of light emitted from the blue emission layer BEML. In an embodiment, the blue auxiliary layer BIL may include an amine-based organic compound, and the resonance may be reinforced by adjusting the thickness of the blue auxiliary layer BIL. In another embodiment, the blue auxiliary layer BIL may include a metal having high reflectivity such as Ag or MgAg and a material for adjusting an optical path such as SiN, $SiO_2$, $TiO_2$, $Ta_2O_5$, ITO, or IZO.

The blue emission layer BEML may be disposed on the blue auxiliary layer BIL. In case that electrons and holes are injected into the blue emission layer BEML, the blue emission layer BEML may emit light of a color. For example, the blue emission layer BEML may include an organic material emitting blue light and may emit blue light.

The first electron transport layer ETL1 may be disposed on the blue emission layer BEML. The first electron transport layer ETL1 may increase electron mobility. In an embodiment, the first electron transport layer ETL1 may include an electron transport material. For example, the first electron transport layer ETL1 may include 8-Hydroxyquinolinolato-lithium (LiQ), Alq3 (tris(8-hydroxyquinolino) aluminum), PBD (2-(4-biphenylyl)-5-(4-tert-butylphenyl)-1,3,4oxadiazole), TAZ, or spiro-PBD. These may be used alone or in combination with each other.

The first n-type charge generation layer nCGL1 may be disposed on the first electron transport layer ETL1. The first n-type charge generation layer nCGL1 may supply electrons to the blue emission layer BEML. For example, the first n-type charge generation layer nCGL1 may include a metal, an alloy, metal an oxide, a reflective conductive material, an organic material doped with an n-type material, or the like.

The first p-type charge generation layer pCGL1 may be disposed on the first n-type charge generation layer nCGL1. The first p-type charge generation layer pCGL1 may supply holes to the red emission layer REML. For example, the first p-type charge generation layer pCGL1 may include a metal, an alloy, metal an oxide, a reflective conductive material, an organic material doped with a p-type material, or the like.

The second hole transport layer HTL2 may be disposed on the first p-type charge generation layer pCGL1. The second hole transport layer HTL2 may increase hole mobility. In an embodiment, the second hole transport layer HTL2 may include a hole transport material.

The red auxiliary layer RIL may be disposed on the second hole transport layer HTL2. The red auxiliary layer RIL may enhance resonance of light emitted from the red emission layer REML.

The red emission layer REML may be disposed on the red auxiliary layer RIL. In case that electrons and holes are injected into the red emission layer REML, the red emission layer REML may emit light of a color. For example, the red emission layer REML may include an organic material emitting red light and may emit red light.

The second electron transport layer ETL2 may be disposed on the red emission layer REML. The second electron transport layer ETL2 may increase electron mobility. In an embodiment, the first electron transport layer ETL1 may include an electron transport material.

The second n-type charge generation layer nCGL2 may be disposed on the second electron transport layer ETL2. The second n-type charge generation layer nCGL2 may supply electrons to the red emission layer REML. For example, the second n-type charge generation layer nCGL2 may include a metal, an alloy, metal an oxide, a reflective conductive material, an organic material doped with an n-type material, or and the like.

The second p-type charge generation layer pCGL2 may be disposed on the second n-type charge generation layer nCGL2. The second p-type charge generation layer pCGL2 may supply holes to the green emission layer GEML. For example, the second p-type charge generation layer pCGL2 may include a metal, an alloy, metal an oxide, a reflective conductive material, and an organic material doped with a p-type material.

The third hole transport layer HTL3 may be disposed on the second p-type charge generation layer pCGL2. The third hole transport layer HTL3 may increase hole mobility. In an embodiment, the third hole transport layer HTL3 may include a hole transport material.

The green auxiliary layer GIL may be disposed on the third hole transport layer HTL3. The green auxiliary layer GIL may enhance resonance of light emitted from the green emission layer GEML.

The green emission layer GEML may be disposed on the green auxiliary layer GIL. In case that electrons and holes are injected into the green emission layer GEML, the green emission layer GEML may emit light of a color. For example, the green emission layer GEML may include an organic material emitting green light and may emit green light.

The first upper electron transport layer UETL1 may be disposed on the green emission layer GEML. The first upper electron transport layer UETL1 may increase electron mobility. In an embodiment, the first upper electron transport layer UETL1 may include an electron transport material.

The common electrode CE may be disposed on the first upper electron transport layer UETL1. In an embodiment, the common electrode CE may include a metal, an alloy, a metal oxide, a reflective conductive material, or the like. For example, the common electrode CE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The capping layer CPL may be disposed on the common electrode CE. By using the refractive index of the capping layer CPL, the light emitted from the blue emission layer BEML, the red emission layer REML, and the green emission layer GEML may resonate, and the light efficiency of the blue emission layer BEML, the red emission layer REML, and the green emission layer GEML may be improved. For example, the capping layer CPL may include an organic material or an inorganic material.

Referring to FIG. 7, the first pixel electrode PE1 and the second pixel electrode PE2 may be disposed in the first deposition region DA1, and a fourth pixel electrode PE4 and a fifth pixel electrode PE5 may be disposed in the second deposition region DA2. Each of the first pixel electrode PE1, the second pixel electrode PE2, the fourth pixel electrode PE4, and the fifth pixel electrode PE5 may be electrically connected to the transistor layer TL through contact holes formed in the via insulating layer VIA.

A pixel defining layer PDL may be formed between the first pixel electrode PE1, the second pixel electrode PE2, the fourth pixel electrode PE4, and the fifth pixel electrode PE5. For example, a width of the pixel defining layer PDL in the first direction D1 may be in a range of about 0.4 um to about 0.7 um.

The pixel defining layer PDL may include an organic material. For example, the pixel defining layer PDL may include a photoresist, a polyacrylic resin, a polyimide resin, or an acrylic resin. These may be used alone or in combination with each other.

A first vertical separator VS1 may be disposed on the pixel defining layer PDL formed in the first deposition region DA1. In an embodiment, the first vertical separation layer VS1 may be disposed between the first pixel electrode PE1 of the first sub-pixel SPX1 and the second pixel electrode PE2 of the second sub-pixel SPX2. As shown in FIG. 5, the first vertical separator VS1 may extend in the second direction D2.

A second vertical separator VS2 may be disposed on the pixel defining layer PDL formed in the second deposition region DA2. In an embodiment, the second vertical separator VS2 may be disposed between the fourth pixel electrode PE4 of the fourth sub-pixel SPX4 and the fifth pixel electrode PE5 of the fifth sub-pixel SPX5. As shown in FIG. 5, the second vertical separation membrane VS2 may extend in the second direction D2.

In an embodiment, the first and second vertical separators VS1 and VS2 may include an organic material. For example, the first and second vertical separators VS1 and VS2 may include a photoresist, a polyacrylic resin, a polyimide resin, or an acrylic resin. These may be used alone or in combination with each other. In another embodiment, the first and second vertical separators VS1 and VS2 may include a metal, an alloy, a metal oxide, a reflective conductive material, or the like.

In an embodiment, as shown in FIG. 7, each of the first and second vertical separators VS1 and VS2 may have a trapezoidal shape in a cross-sectional view. In another embodiment, each of the first and second vertical separators VS1 and VS2 may have an inverted trapezoidal shape in a cross-sectional view.

In an embodiment, the first common layer CL1 may be formed in the first deposition area DA1 and may be disconnected by the first vertical separator VS1. Accordingly, the first common layer CL1 formed on the first pixel electrode PE1 and the first common layer CL1 formed on the second pixel electrode CE2 may not be electrically connected to each other. For example, a thickness of the first common layer CL1 in the third direction D3 may be in a range of about 3000 angstroms to about 7000 angstroms.

In an embodiment, the second common layer CL2 may be formed in the second deposition area DA2 and may be disconnected by the second vertical separator VS2. Accordingly, the second common layer CL2 formed on the fourth pixel electrode PE4 and the second common layer CL2 formed on the fifth pixel electrode PE5 may not be electrically connected to each other. For example, the thickness of the second common layer CL2 and the thickness of the first common layer CL1 in the third direction D3 may be substantially the same.

The second common layer CL2 may be disconnected from the first common layer CL1 in the overlapping region OA. Accordingly, the second common layer CL2 and the first common layer CL1 may not be electrically connected to each other.

In an embodiment, the first upper electron transport layer UETL1 may be formed in the first deposition region DA1 and may be disposed on the first common layer CL1. The first upper electron transport layer UETL1 may be formed to cover top and side surfaces of the first common layer CL1 and may extend to the overlapping region OA. The first upper electron transport layer UETL1 may be disconnected by the first vertical separator VS1.

In an embodiment, the second upper electron transport layer UETL2 may be formed in the second deposition region DA2 and may be disposed on the second common layer CL2. The second upper electron transport layer UETL2 may be formed to cover top and side surfaces of the second common layer CL2 and may extend to the overlapping region OA. The second upper electron transport layer UETL2 may be disconnected by the second vertical separator VS2.

The second upper electron transport layer UETL2 may contact the first upper electron transport layer ETL1 in the overlapping region OA.

In an embodiment, the common electrode CE may be formed in the first deposition region DA1, the overlapping region OA, and the second deposition region DA2, and may be disposed on the first and second upper electron transport layers UETL1 and UETL2. The common electrode CE disposed on the first upper electron transport layer UETL1 may be connected to the common electrode CE disposed on the second upper electron transport layer UETL2 in the overlapping region OA.

The display device 1000 according to an embodiment of the disclosure may be partitioned into the first deposition region DA1, the second deposition region DA2, and the overlapping region OA. The first and second pixels PX1 and PX2 may be disposed in the first deposition region DA1, and the third and fourth pixels PX3 and PX4 may be disposed in the second deposition region DA2. A vertical separator may be formed in each of the first to fourth pixels PX1 to PX4, and each of the first to fourth pixels PX1 to PX4 may include a common layer, an upper electron transport layer, and a common electrode. For example, the first vertical separator VS1 may be formed in the first pixel PX1, and the first pixel PX1 may include the first common layer CL1, the first upper electron transport layer UETL1, and the common electrode CE. The second vertical separator VS2 may be formed in the third pixel PX3, and the third pixel PX3 may include the second common layer CL2, the second upper electron transport layer UETL2, and the common electrode CE.

The first common layer CL1 may be disconnected by the first vertical separator VS1 in the first deposition region DA1. The second common layer CL2 may be disconnected by the second vertical separator VS2 in the second deposition region DA2. The second common layer CL2 may be disconnected from the first common layer CL1 in the overlapping region OA. Accordingly, the current applied from the first pixel electrode PE1 to the first common layer CL1 may not leak into the first common layer CL1 disposed on the second pixel electrode PE2. The current applied to the second pixel electrode PE2 may not leak into the second common layer CL2 disposed on the fourth pixel electrode PE4.

The first upper electron transport layer UETL1 may be formed to cover top and side surfaces of the first common layer CL1. Accordingly, the first common layer CL1 may not be exposed. The second upper electron transport layer UETL2 may be formed to cover top and side surfaces of the second common layer CL2. Accordingly, the second common layer CL2 may not be exposed. Therefore, even in case that an alignment error occurs in the process of manufacturing the first common layer CL1 or the second common layer CL2, the first common layer CL1 and the second common layer CL2 may be covered by the first upper electron transport layer UETL1 and the second upper electron transport layer UETL2, respectively, and the first common layer CL1 and the second common layer CL2 may not contact each other. As the first and second common layers CL1 and CL2 (e.g., a hole transport layer or a charge generating layer), which are main paths of leakage current, are covered by the first and second upper electron transport layers UETL1 and UETL2, the first and second common layers CL1 and CL2 may not contact each other even in case that an alignment error occurs.

No separator may be formed in the overlapping region OA of the display device 1000. Accordingly, the first upper electron transport layer UETL1 and the second upper electron transport layer UELT2 may contact each other without being disconnected from each other in the overlapping region OA. Accordingly, the first upper electron transport layer UETL1 and the second upper electron transport layer UELT2 may be electrically connected to each other.

The common electrode CE may be connected through the overlapping region OA without being disconnected in the overlapping region OA. Accordingly, the common electrodes CE may be electrically connected to each other. Accordingly, an IR drop phenomenon of the common electrode CE may be prevented.

FIGS. 8 to 22 are schematic diagrams illustrating a method of manufacturing the display device of FIG. 7.

Figure 8:
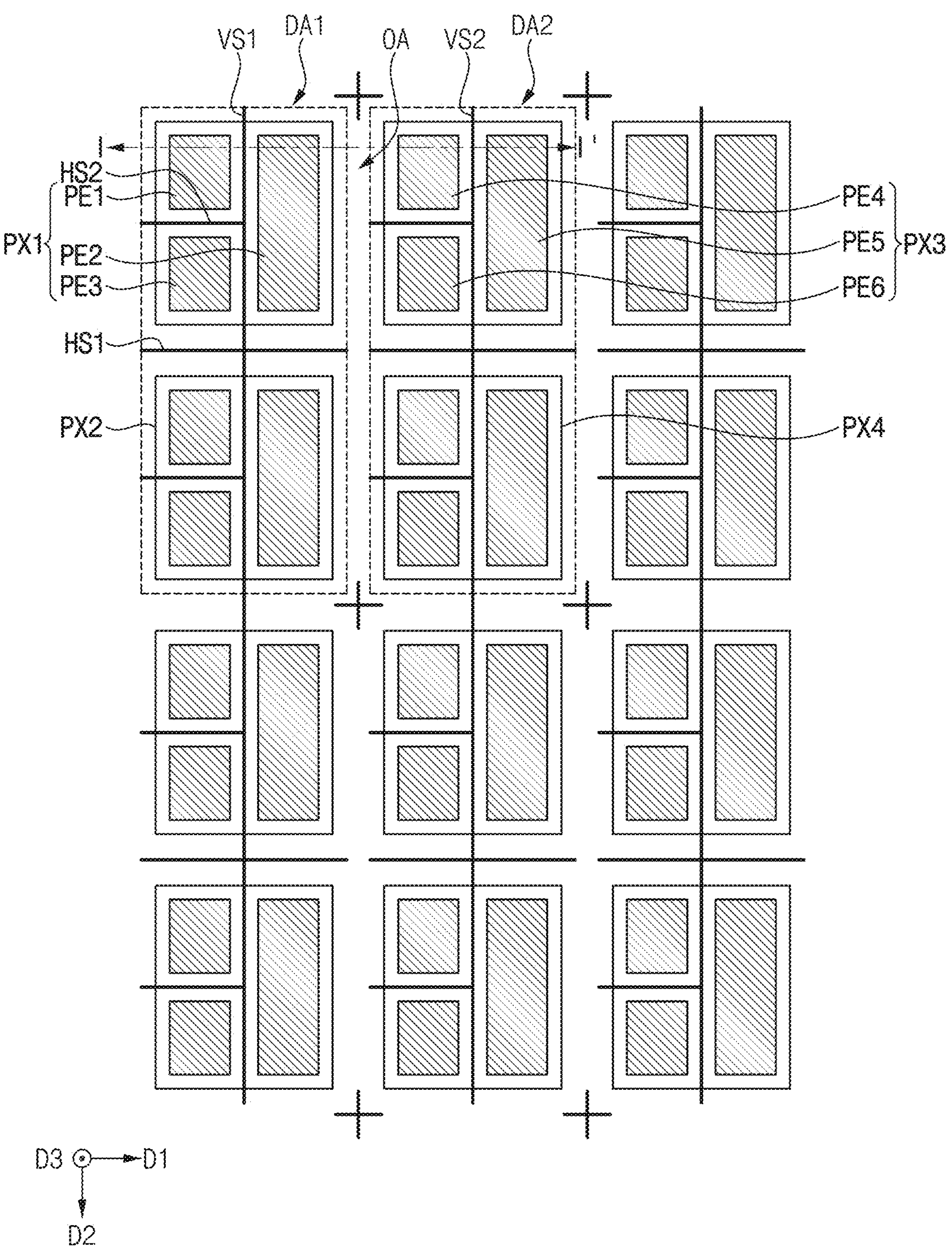
FIGS. 8 to 22 are schematic diagrams illustrating a method of manufacturing the display device of FIG. 7.
Figure 9:
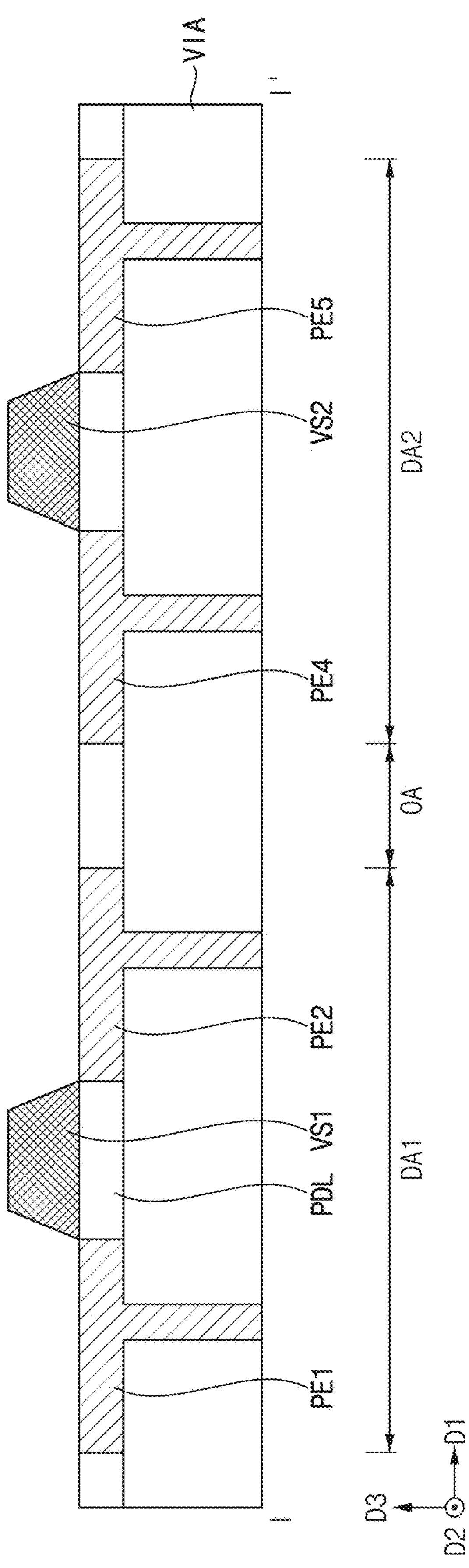

Referring to FIGS. 8 and 9, pixel electrodes and the pixel defining layer PDL may be formed on the via insulating layer VIA. For example, the first to sixth pixel electrodes PE1, PE2, PE3, PE4, PE5, and PE6 may be formed on the via insulating layer VIA.

The first and second vertical separators VS1 and VS2 may be formed on the pixel defining layer PDL. In an embodiment, the first vertical separator VS1 may be disposed between the first pixel electrode PE1 and the second pixel electrode PE2 and may extend in the second direction D2. The second vertical separator VS2 may be disposed on the fourth pixel electrode PE4 and the fifth pixel electrode PE5 and may extend in the second direction D2.

In an embodiment, first and second horizontal separators HS1 and HS2 may be further formed. For example, the first horizontal separator HS1 may be disposed between the first pixel PX1 and the second pixel PX2 and may extend in the first direction D1. The second horizontal separator HS2 may be disposed between the first pixel electrode PE1 and the third pixel electrode PE3 and may extend in the first direction D1.

In an embodiment, the first and second vertical separators VS1 and VS2 may be formed together with the first and second horizontal separators HS1 and HS2. Accordingly, the first and second vertical separators VS1 and VS2 and the first and second horizontal separators HS1 and HS2 may include substantially the same material.

In an embodiment, no separator may be formed in the overlapping region OA.

Figure 10:
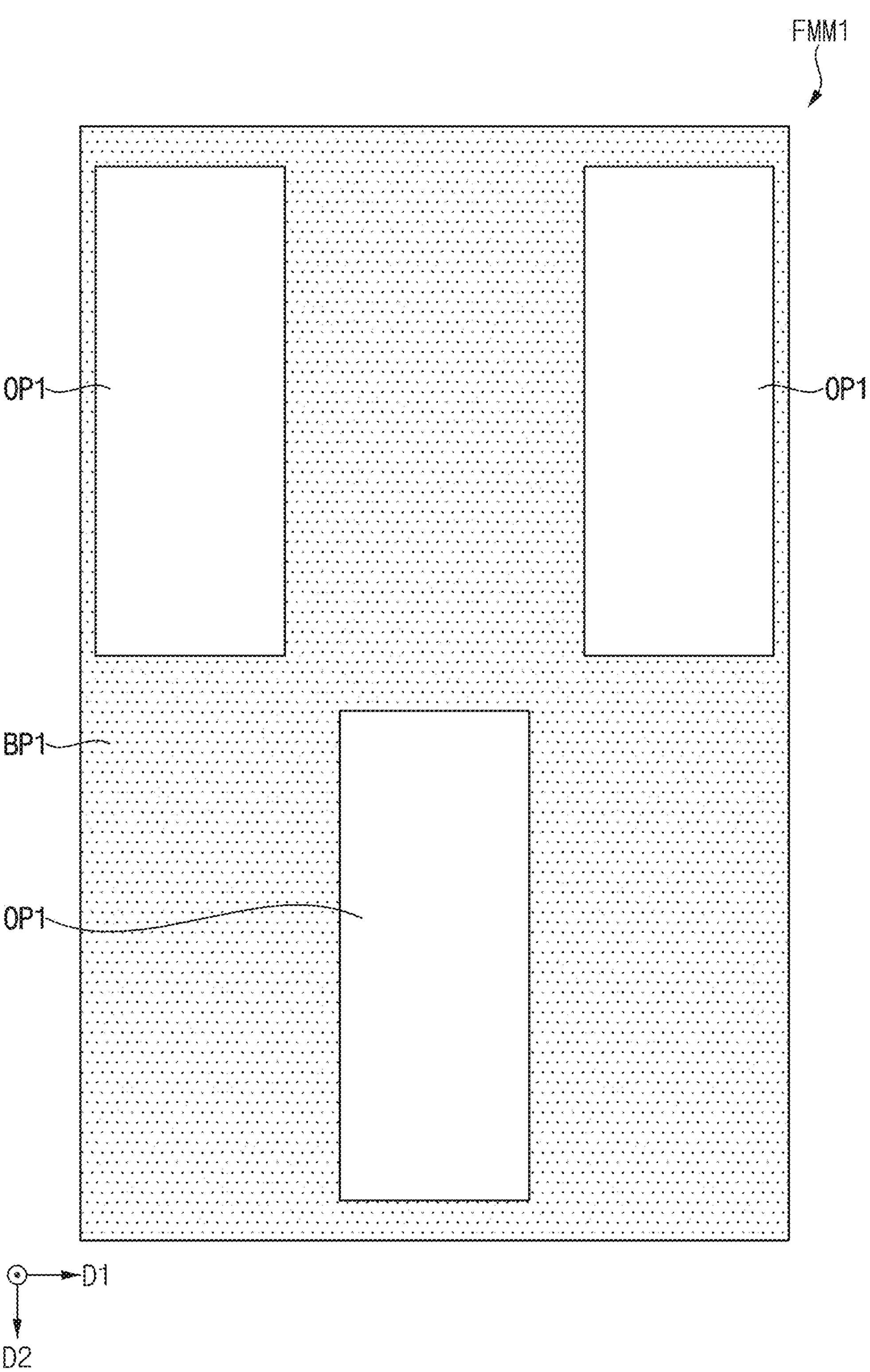
Figure 11:
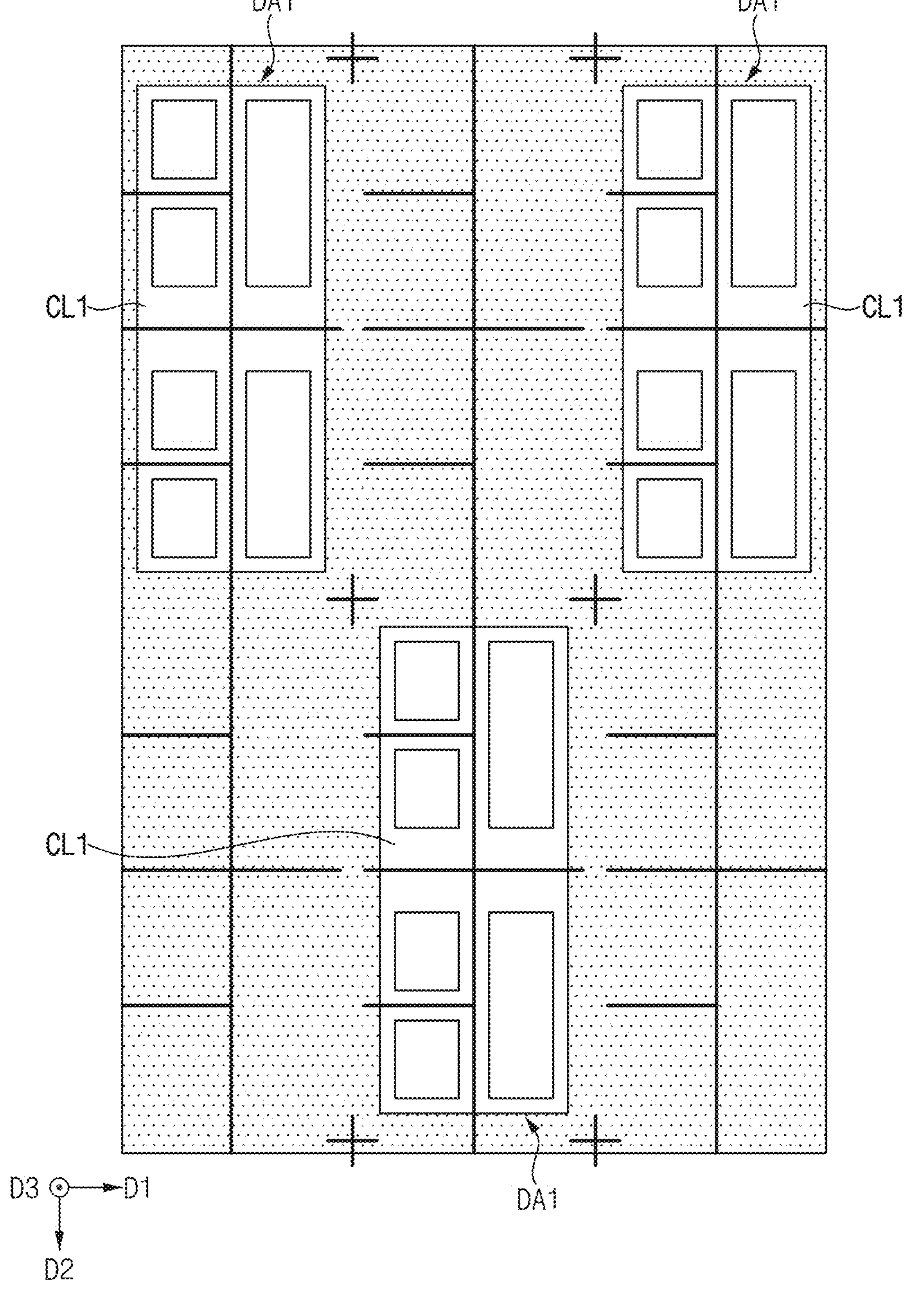
Figure 12:
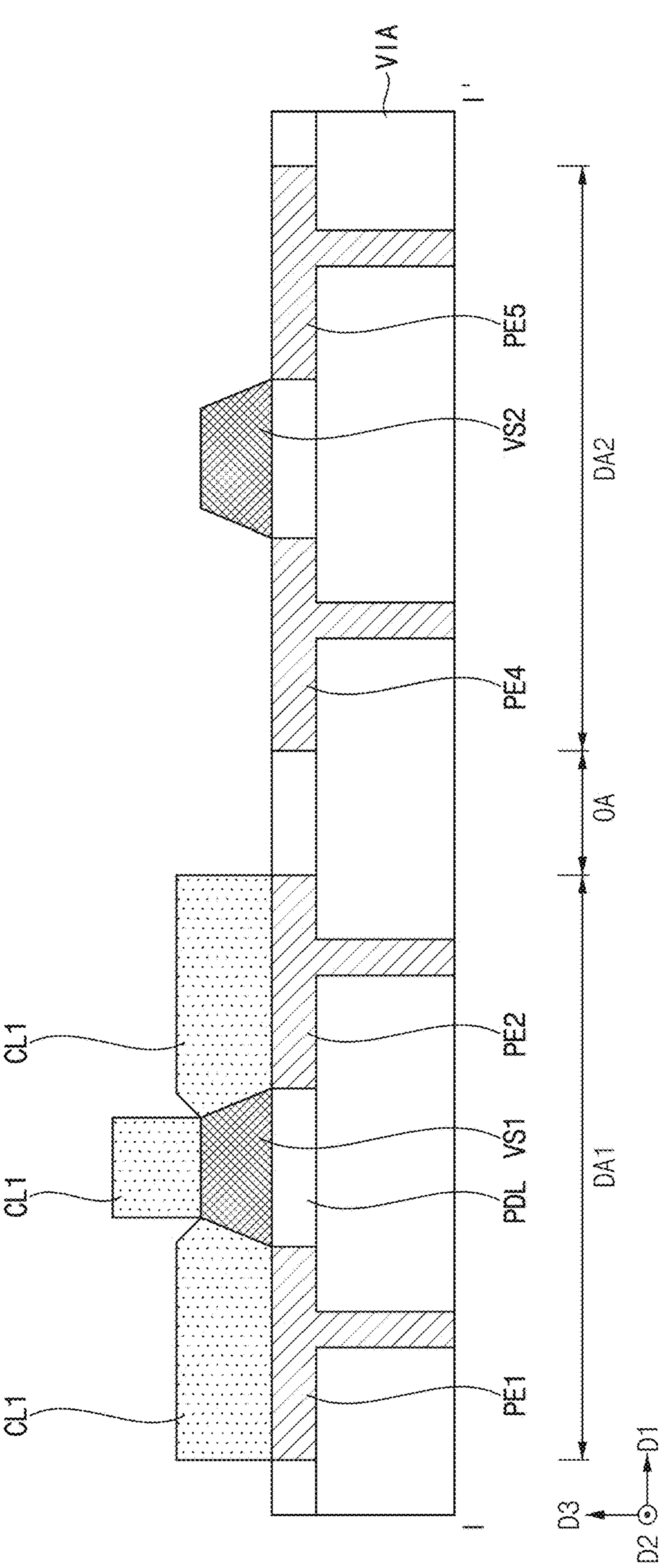

Referring to FIGS. 10, 11, and 12, the first common layer CL1 may be formed in the first deposition region DA1. As shown in FIG. 12, the first common layer CL1 may be disconnected by the first vertical separator VS1.

In an embodiment, the first common layer CL1 may be formed through a first fine metal mask FMM1. For example, as shown in FIG. 10, the first fine metal mask FMM1 may include a first open portion OP1 and a first blocking portion BP1. The first open portion OP1 may pass the deposition material forming the first common layer CL1, and the first blocking portion BP1 may block the deposition material.

As shown in FIG. 11, the first fine metal mask FMM1 may be loaded such that the first open portion OP1 corresponds to the first deposition region DA1. Accordingly, the first common layer CL1 may be formed in the first deposition region DA1.

Figure 13:
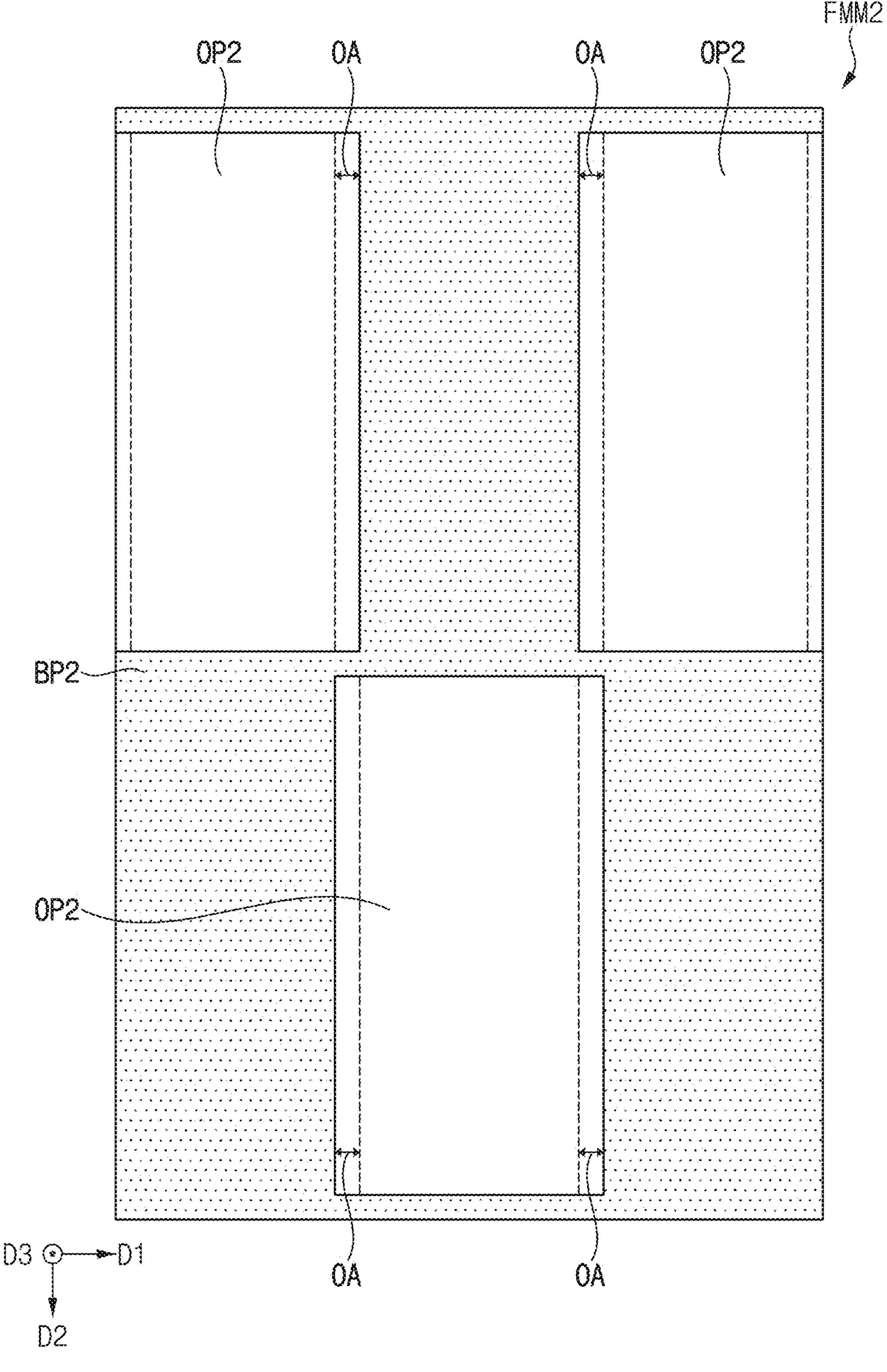
Figure 14:
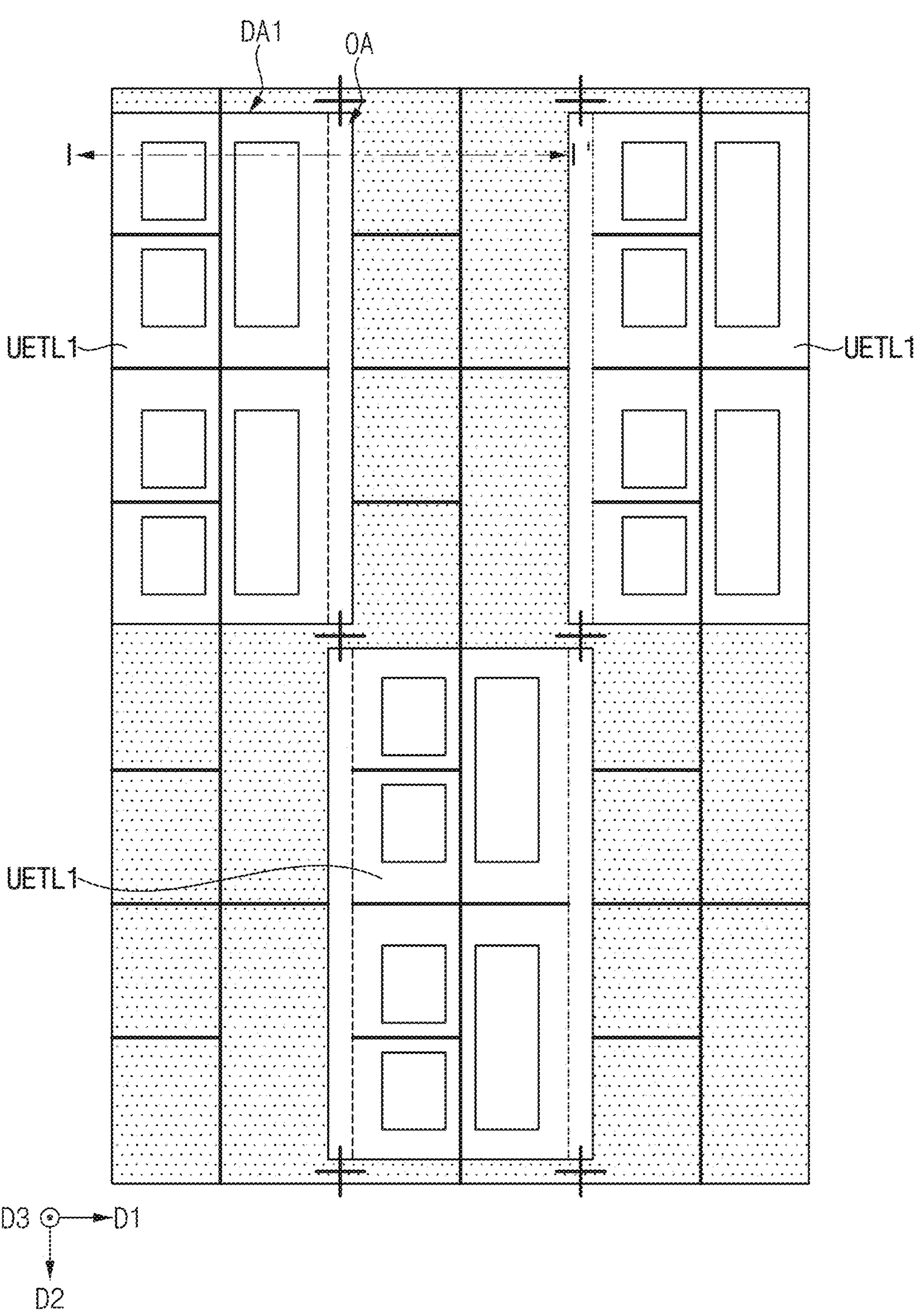
Figure 15:
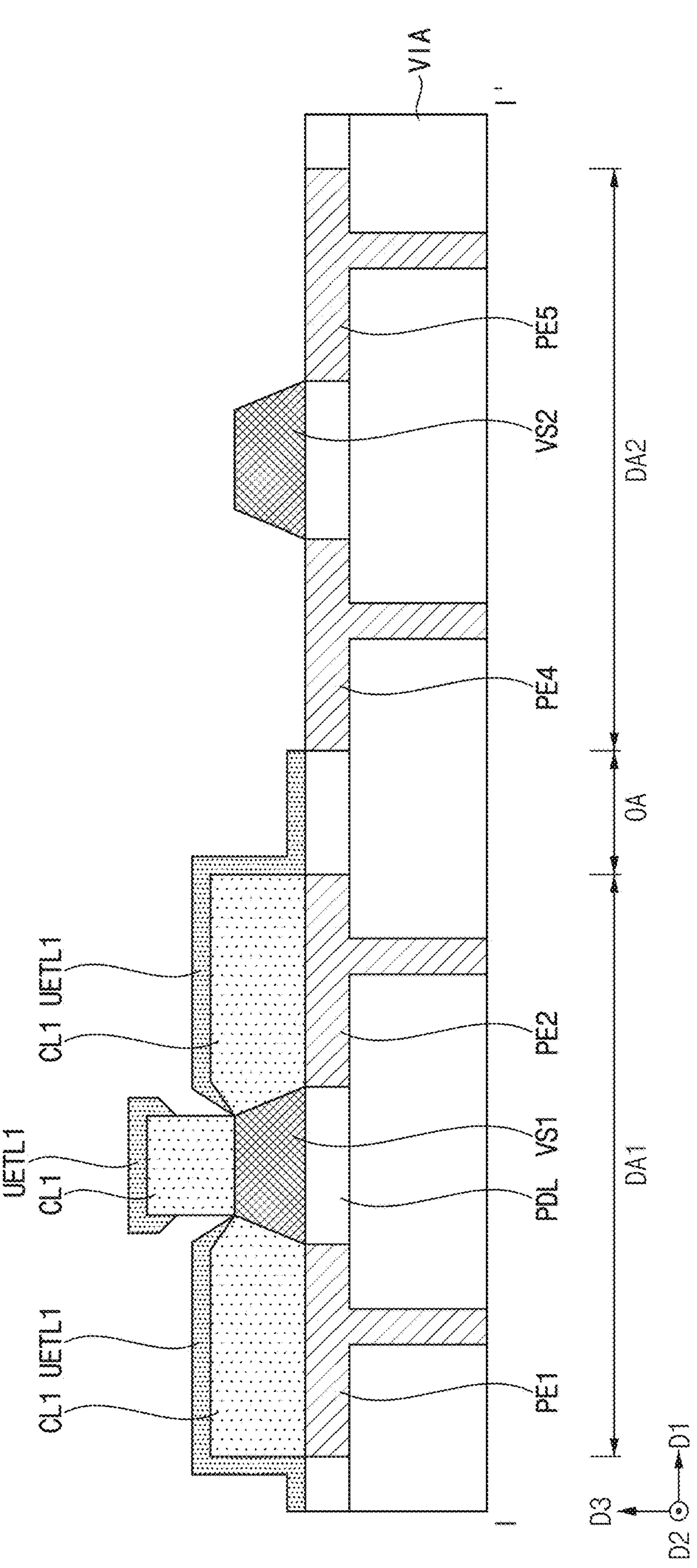

Referring to FIGS. 13, 14, and 15, the first upper electron transport layer UETL1 may be formed in the first deposition region DA1 and the overlapping region OA. As shown in FIG. 15, the first upper electron transport layer UETL1 may be disconnected by the first vertical separator VS1.

In an embodiment, the first upper electron transport layer UETL1 may be formed through a second fine metal mask FMM2. For example, as shown in FIG. 13, the second fine metal mask FMM2 may include a second open portion OP2 and a second blocking portion BP2. The second open portion OP2 may pass the deposition material forming the first upper electron transport layer UETL1, and the second blocking portion BP2 may block the deposition material.

In an embodiment, the second open portion OP2 may be larger than the first open portion OP1 of the first fine metal mask FMM1 in a plan view. For example, a width of the second open portion OP2 may be greater than a width of the first open portion OP1 by about twice of the width of the overlapping region OA2 in the first direction D1.

As shown in FIG. 14, the second fine metal mask FMM2 may be loaded such that the second open portion OP2 corresponds to the first deposition region DA1 and the overlapping region OA. Accordingly, the first upper electron transport layer UETL1 may be formed in the first deposition region DA1 and the overlapping region OA.

Figure 16:
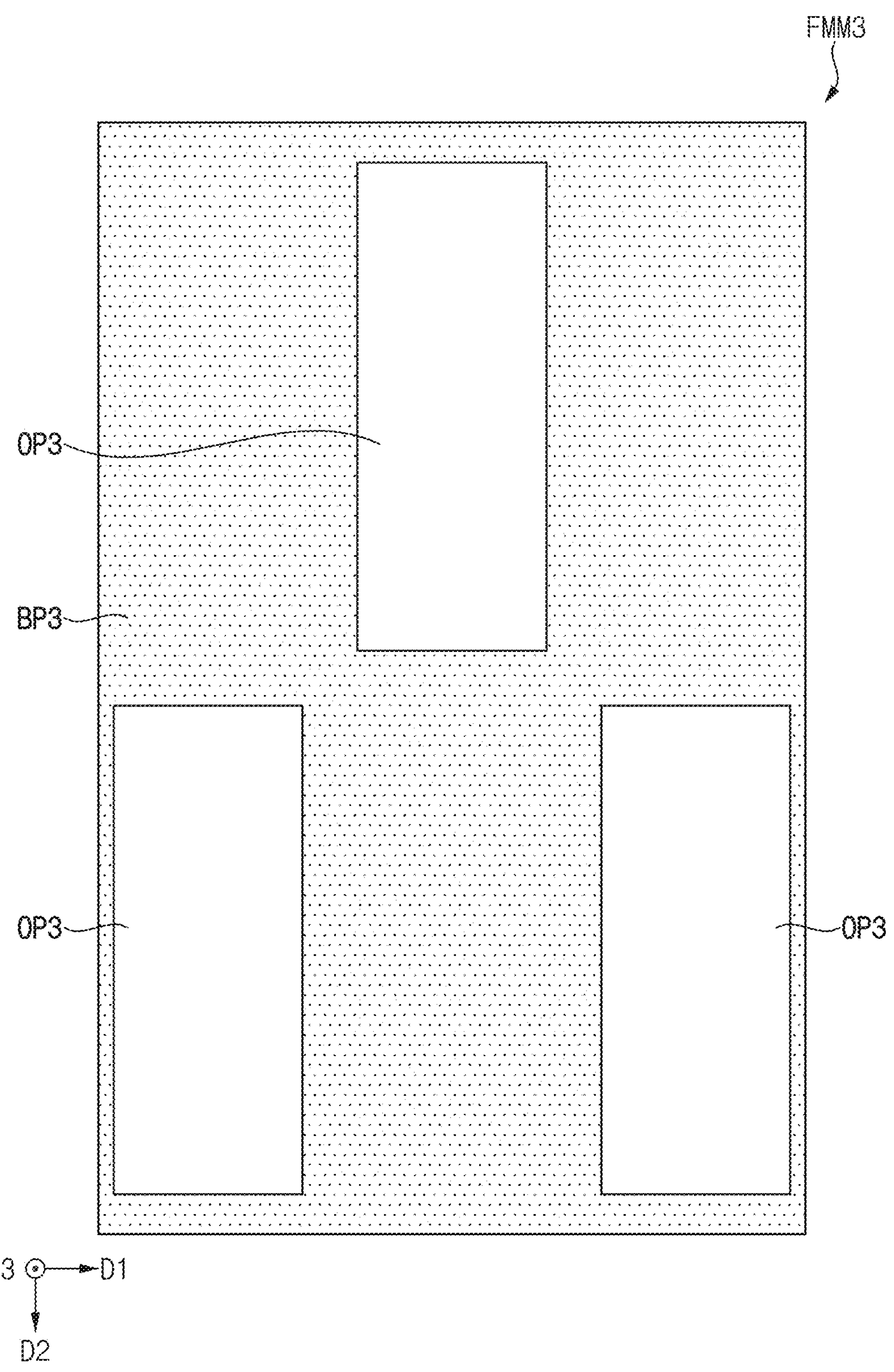
Figure 17:
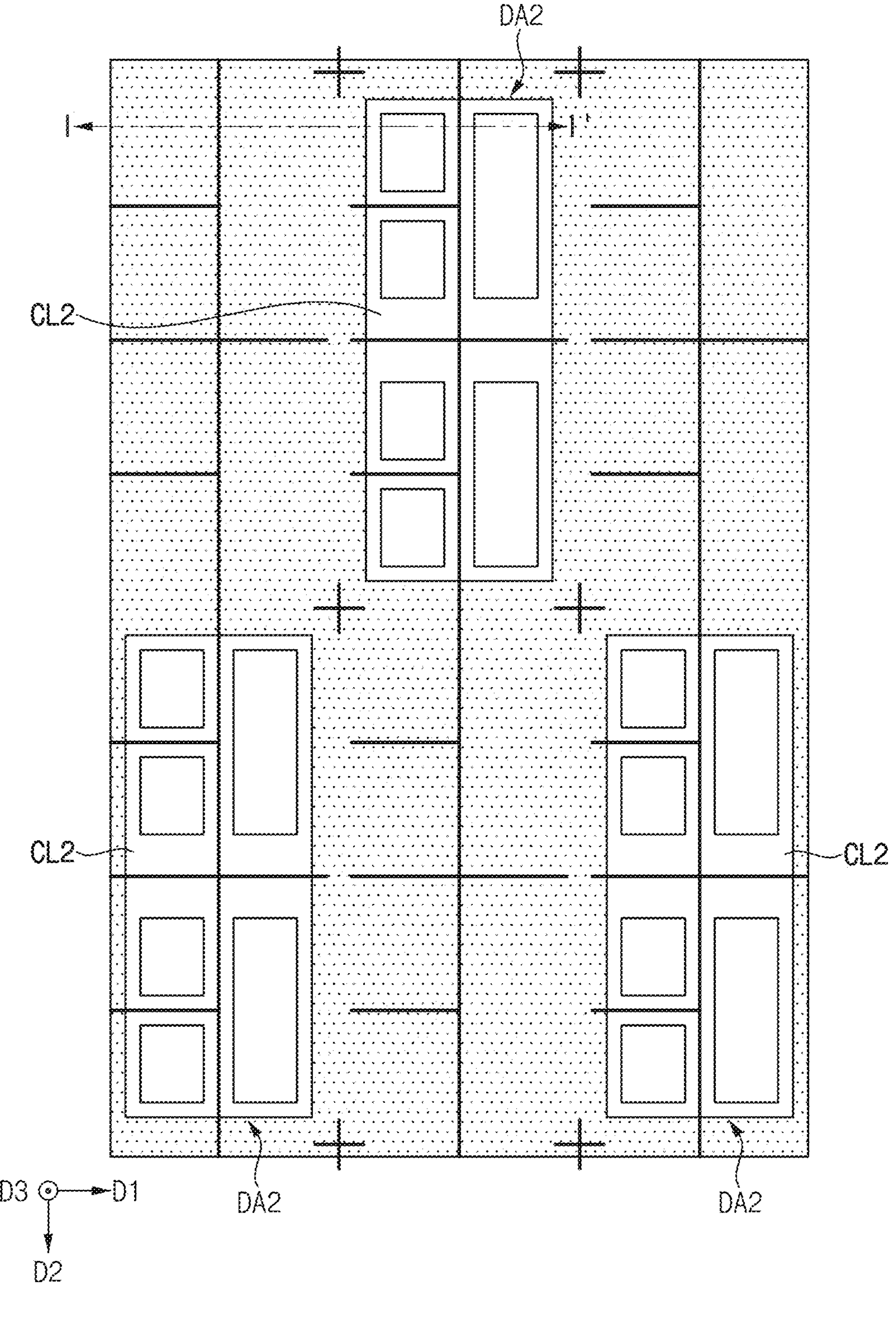
Figure 18:
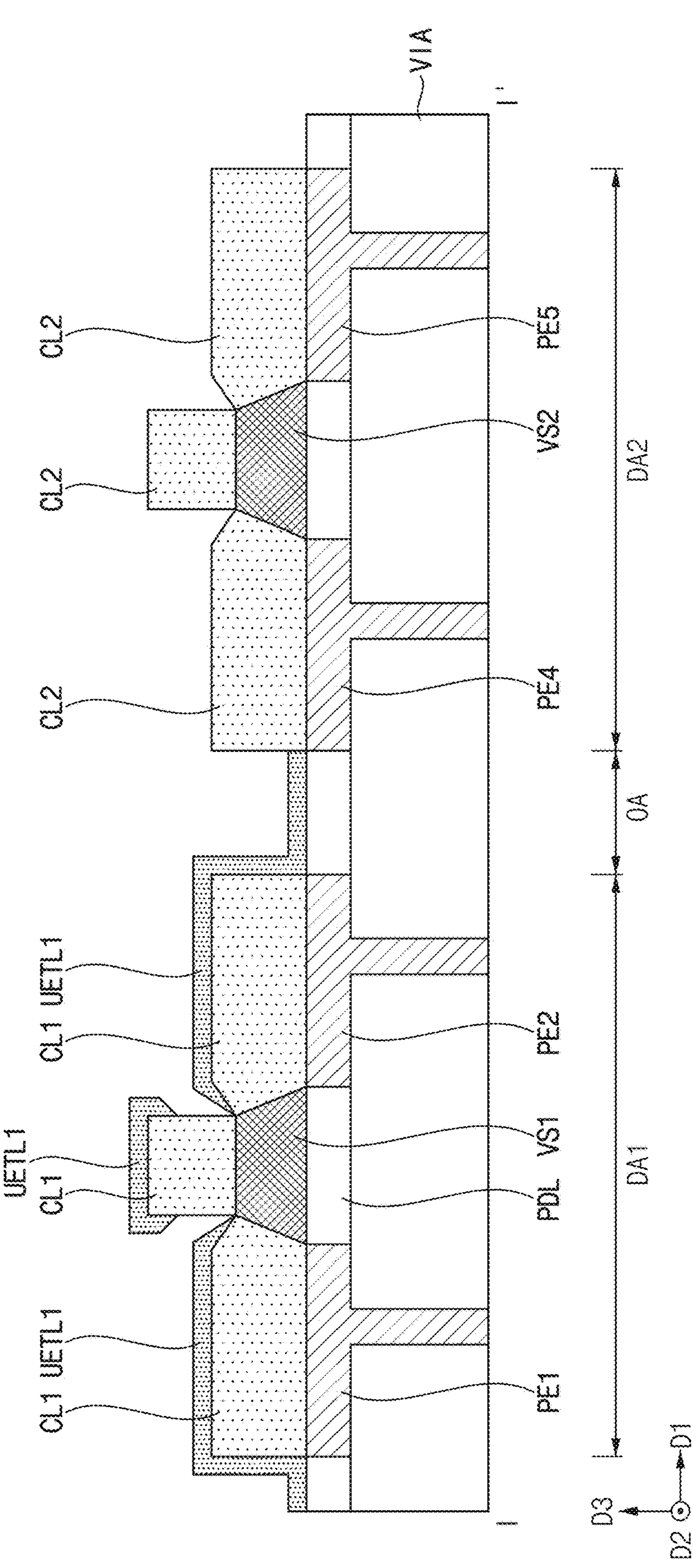

Referring to FIGS. 16, 17, and 18, the second common layer CL2 may be formed in the second deposition region DA2. As shown in FIG. 18, the second common layer CL2 may be disconnected by the second vertical separator VS2. The second common layer CL2 may be disconnected from the first common layer CL1 in the overlapping region OA.

In an embodiment, the second common layer CL2 may be formed through a third fine metal mask FMM3. For example, as shown in FIG. 16, the third fine metal mask FMM3 may include a third open portion OP3 and a third blocking portion BP3. The third open portion OP3 may pass the deposition material forming the second common layer CL2, and the third blocking portion BP3 may block the deposition material.

In an embodiment, an area of the third open portion OP3 and an area of the first open portion OP1 of the first fine metal mask FMM1 may be substantially the same in a plan view. In other words, an area of the second deposition region DA2 and an area of the first deposition region DA1 may be substantially the same in a plan view.

As shown in FIG. 17, the third fine metal mask FMM3 may be loaded such that the third open portion OP3 corresponds to the second deposition region DA2. Accordingly, the second common layer CL2 may be formed in the second deposition region DA2.

Figure 19:
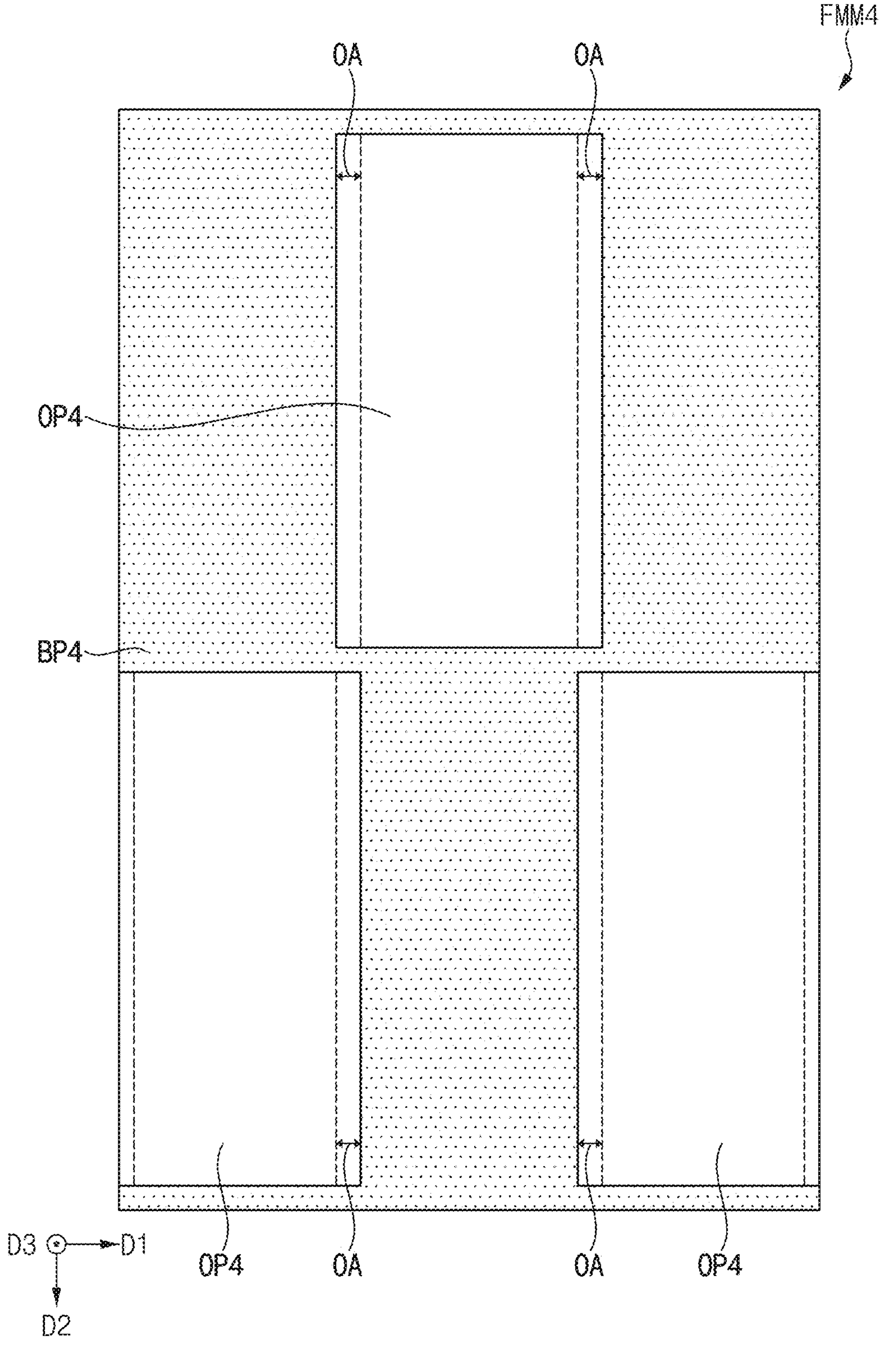
Figure 20:
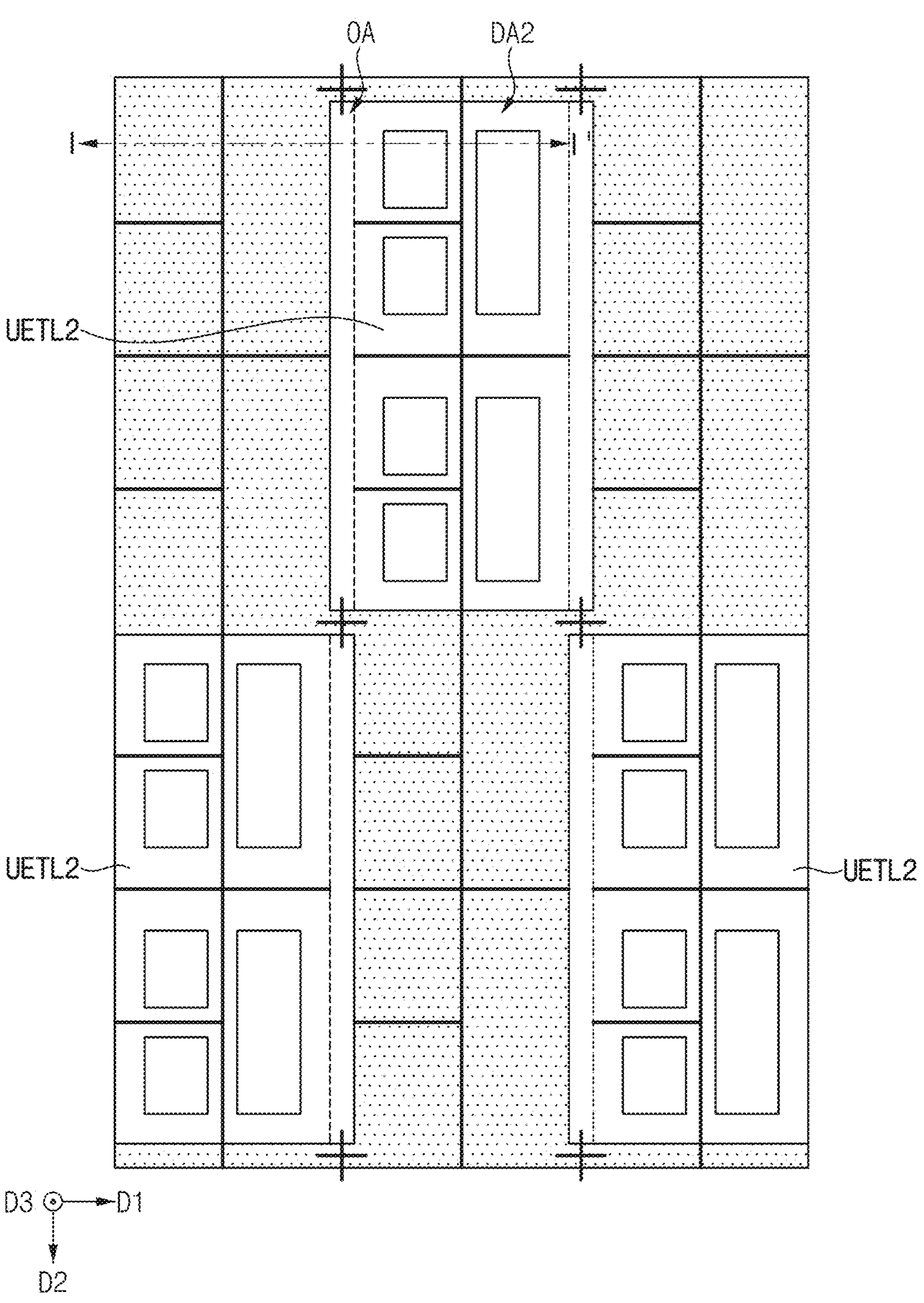
Figure 21:
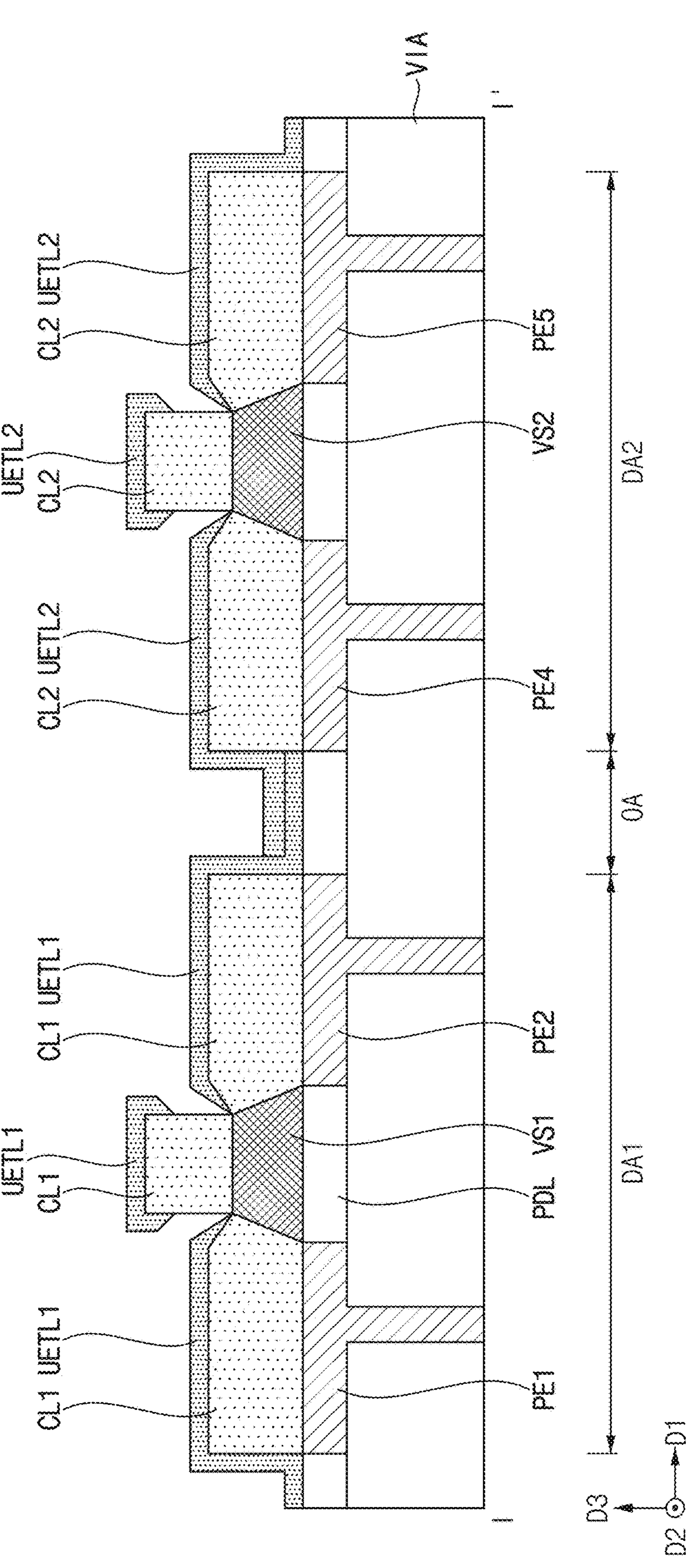

Referring to FIGS. 19, 20, and 21, the second upper electron transport layer UETL2 may be formed in the second deposition region DA2 and the overlapping region OA. As shown in FIG. 21, the second upper electron transport layer UETL2 may be disconnected by the second vertical separator VS2. The second upper electron transport layer UETL2 may contact the first upper electron transport layer UETL1 in the overlapping region OA.

In an embodiment, the second upper electron transport layer UETL2 may be formed through a fourth fine metal mask FMM4. For example, as shown in FIG. 19, the fourth fine metal mask FMM4 may include a fourth open portion OP4 and a fourth blocking portion BP4. The fourth open portion OP4 may pass the deposition material forming the second upper electron transport layer UETL2, and the fourth blocking portion BP4 may block the deposition material.

In an embodiment, the fourth open portion OP4 may be larger than the third open portion OP3 of the third fine metal mask FMM3 in a plan view. For example, a width of the fourth open portion OP4 may be greater than a width of the third open portion OP3 by about twice of a width of the overlapping region OA in the first direction D1.

In an embodiment, an area of the fourth open portion OP4 and an area of the second open portion OP2 of the second fine metal mask FMM2 may be substantially the same in a plan view.

As shown in FIG. 20, the fourth fine metal mask FMM4 may be loaded such that the fourth open portion OP4 corresponds to the second deposition region DA2 and the overlapping region OA. In an embodiment, the second fine metal mask FMM2 and the fourth fine metal mask FMM4 may be loaded such that the second open portion OP2 and the fourth open portion OP4 overlap to each other in the overlapping region OA in a plan view. Accordingly, the second upper electron transport layer UETL2 may be formed in the second deposition region DA2 and the overlapping region OA, and the second upper electron transport layer UETL2 may contact the first upper electron transport layer UETL1 in the overlapping region OA.

In an embodiment, as described above, the first common layer CL1, the first upper electron transport layer UETL1, the second common layer CL2, and the second upper electron transport layer UETL2 may be sequentially formed.

In an embodiment, the display device 1000 may have a W-OLED structure in which the blue emission layer BEML, the red emission layer REML, and the green emission layer GEML are sequentially stacked. As described above, since the display device 1000 of the W-OLED structure is manufactured through the fine metal mask, leakage current between common layers may be prevented.

Figure 22:
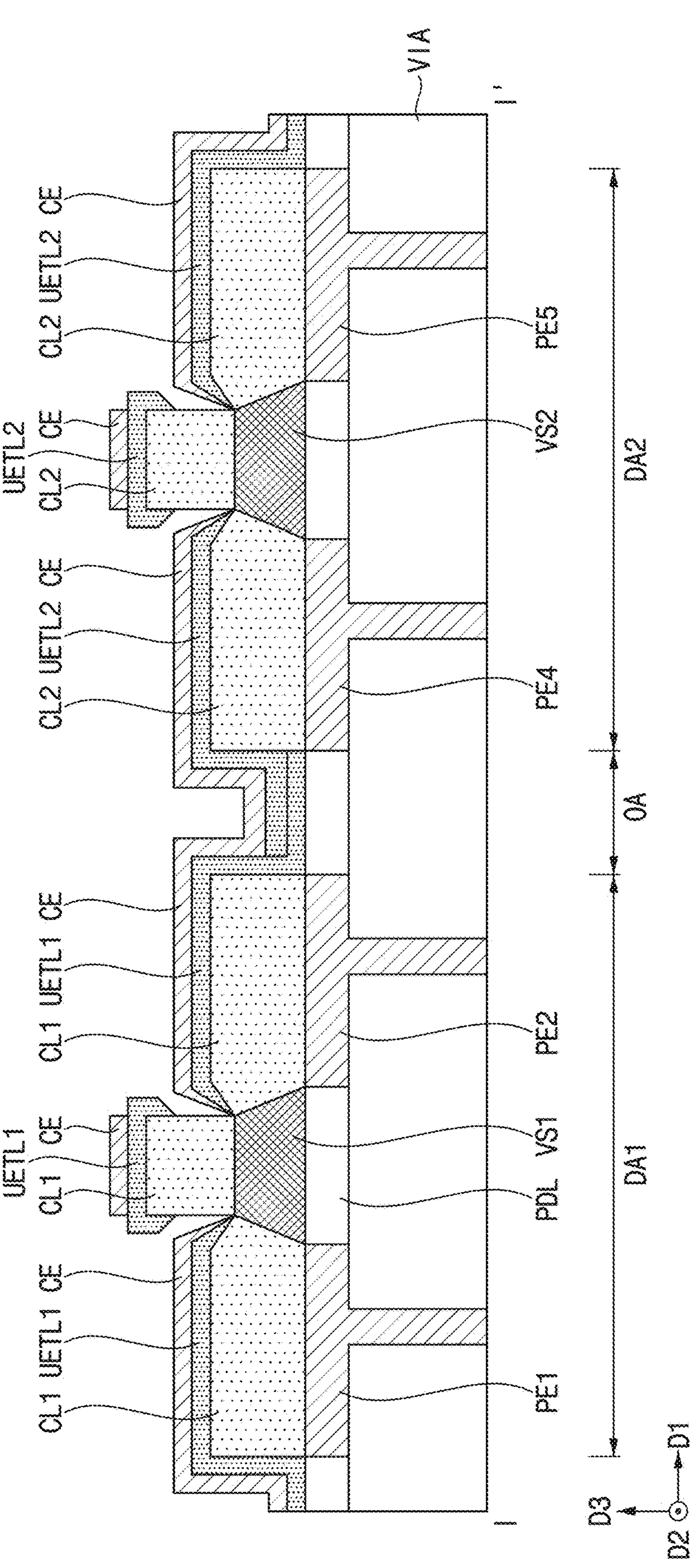

Referring to FIG. 22, the common electrode CE connected in the overlapping region OA may be formed on the first common layer CL1 and the second common layer CL2. In an embodiment, the common electrode CE may be formed through an open mask. As the common electrode CE is formed as a plate electrode through an open mask, a voltage drop phenomenon of the common electrode CE may be prevented.

Figure 23:
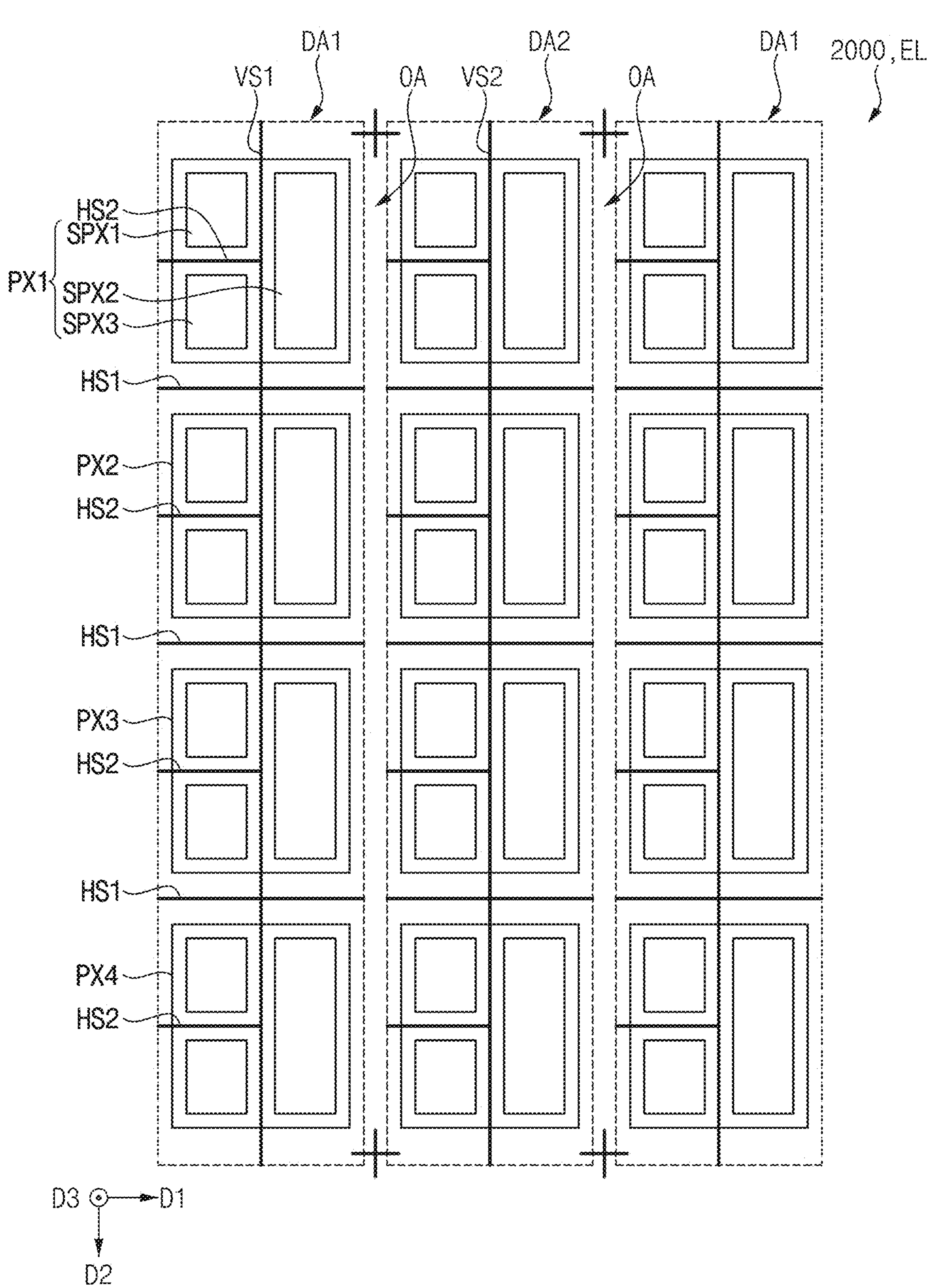
FIG. 23 is a plan view illustrating an emission layer included in a display device according to another embodiment of the disclosure.

FIG. 23 is a plan view illustrating an emission layer included in a display device according to another embodiment of the disclosure.

Referring to FIG. 23, a display device 2000 according to another embodiment of the disclosure may include an emission layer EL. However, the display device 2000 may be substantially the same as the aforementioned display device 1000 except for the emission layer EL.

Multiple deposition regions and multiple overlapping regions may be defined in the emission layer EL. For example, a first deposition region DA1 and a second deposition region DA2 may be defined in the emission layer EL. The first deposition region DA1 and the second deposition region DA2 may be disposed adjacent to each other, alternately arranged in the first direction D1 and the second direction D2. The overlapping region OA may be positioned between the first deposition region DA1 and the second deposition region DA2.

Multiple pixels may be disposed in the first deposition region DA1. For example, as shown in FIG. 23, a first pixel PX1, a second pixel PX2, a third pixel PX3, and a fourth pixel PX4 may be disposed in the first deposition region DA1. The second pixel PX2 may be disposed adjacent to the first pixel PX1 in the second direction D2, the third pixel PX3 may be disposed adjacent to the second pixel PX2 in the second direction D2, and the fourth pixel PX4 may be disposed adjacent to the third pixel PX3 in the second direction D2.

The second deposition region DA2 and the first deposition region DA1 may have a same structure. For example, four pixels may be disposed in the second deposition region DA2. The first deposition region DA1 and the second deposition region DA2 may be alternately arranged in the first direction D1 and the second direction D2.

In an embodiment, the display device 2000 may include multiple separators. For example, a first vertical separator VS1, first horizontal separators HS1, and second horizontal separators HS2 may be formed in the first deposition region DA1. The separators disposed in the second deposition region DA2 and the separators disposed in the first deposition region DA1 may be arranged substantially the same.

The first vertical separator VS1 may be disposed between the first sub-pixel SPX1 and the second sub-pixel SPX2 and may extend in the second direction D2. The first horizontal separators HS1 may be disposed between the first to fourth pixels PX1, PX2, PX3, and PX4 and may extend in the first direction D1. The second horizontal separators HS2 may be disposed between the first sub-pixel SPX1 and the third sub-pixel SPX3 and may extend in the first direction D1.

FIGS. 24 to 36 are schematic diagrams illustrating a method of manufacturing the display device of FIG. 23.

Figure 24:
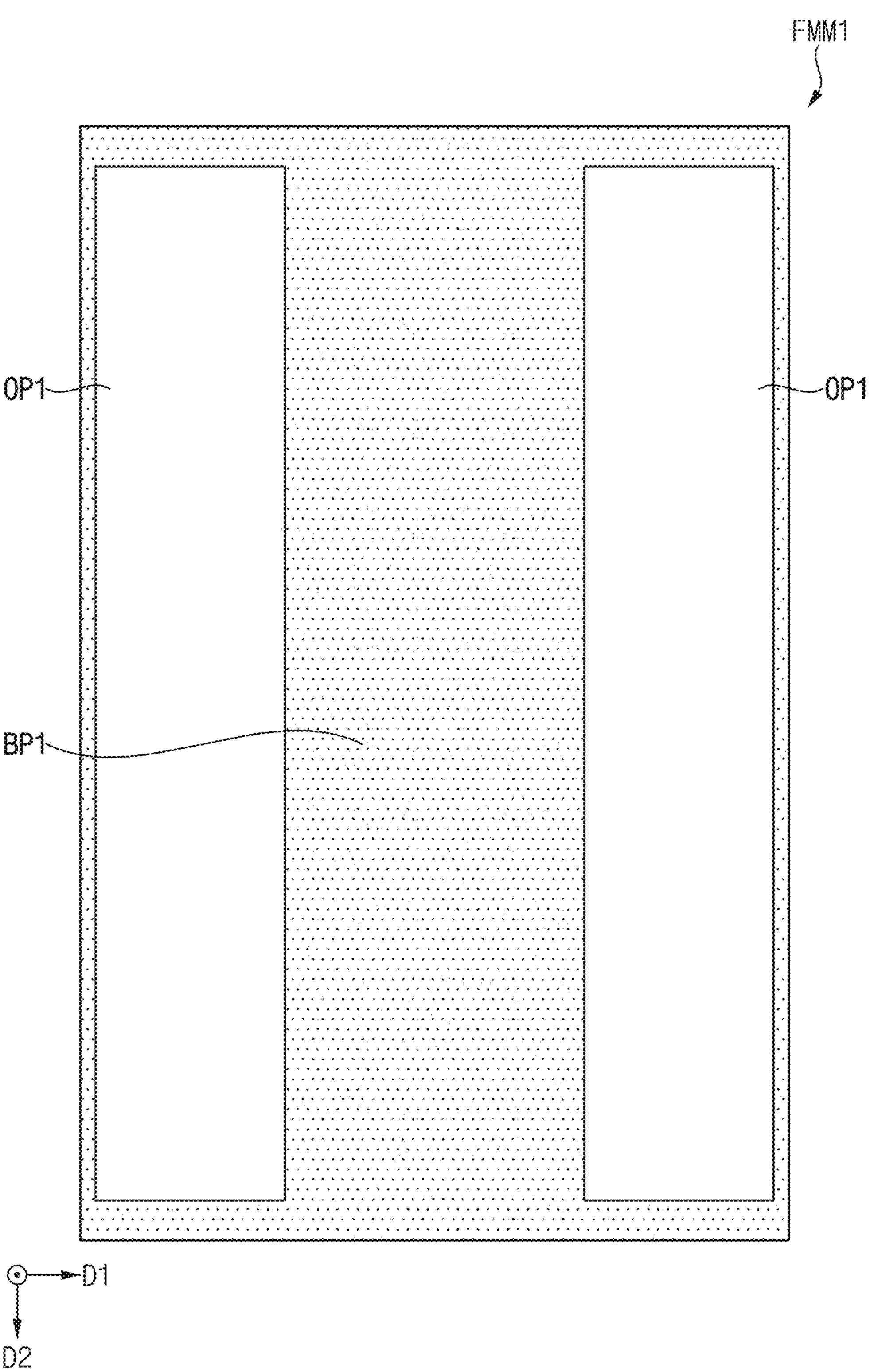
Figure 25:
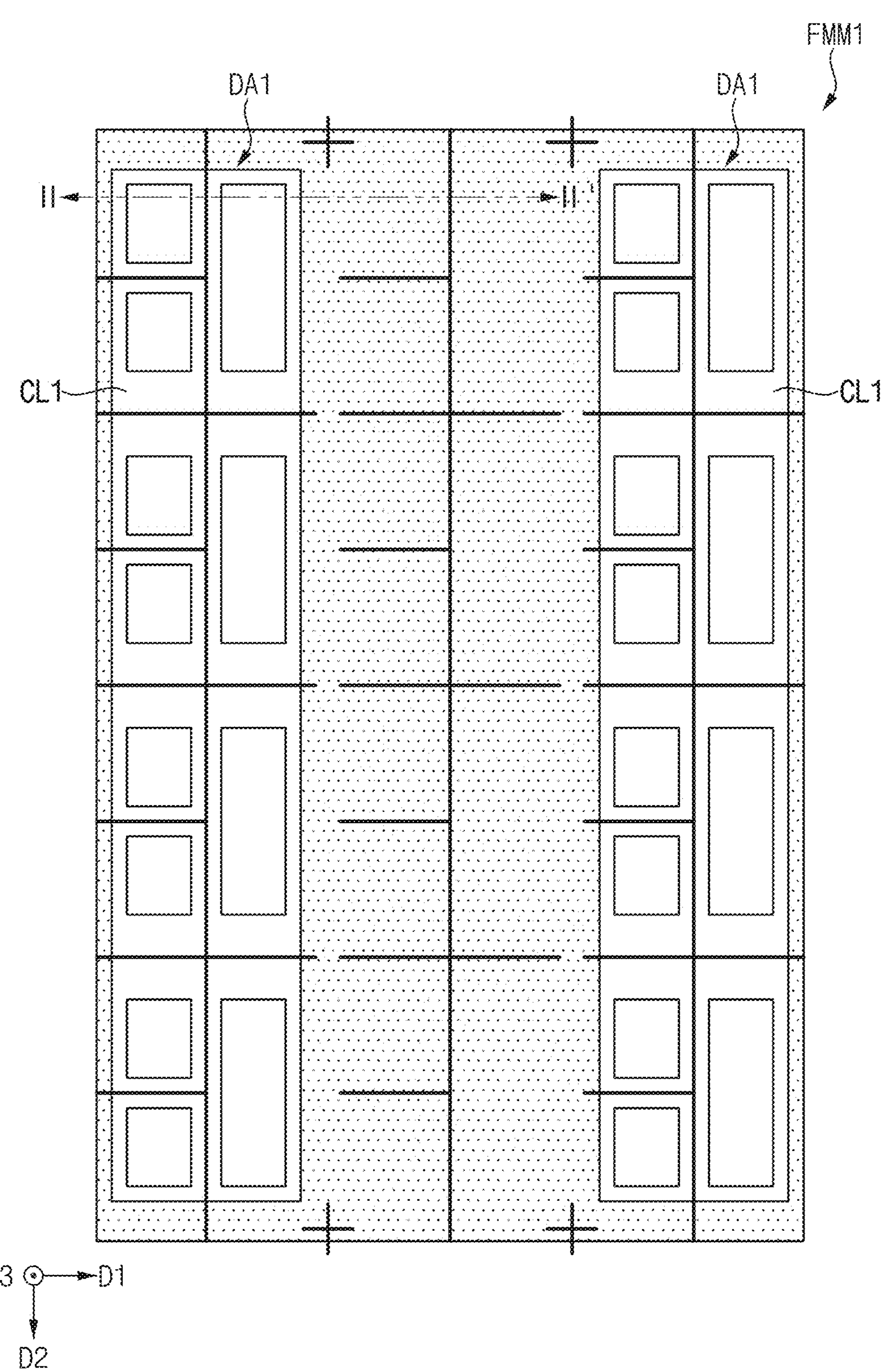
Figure 26:
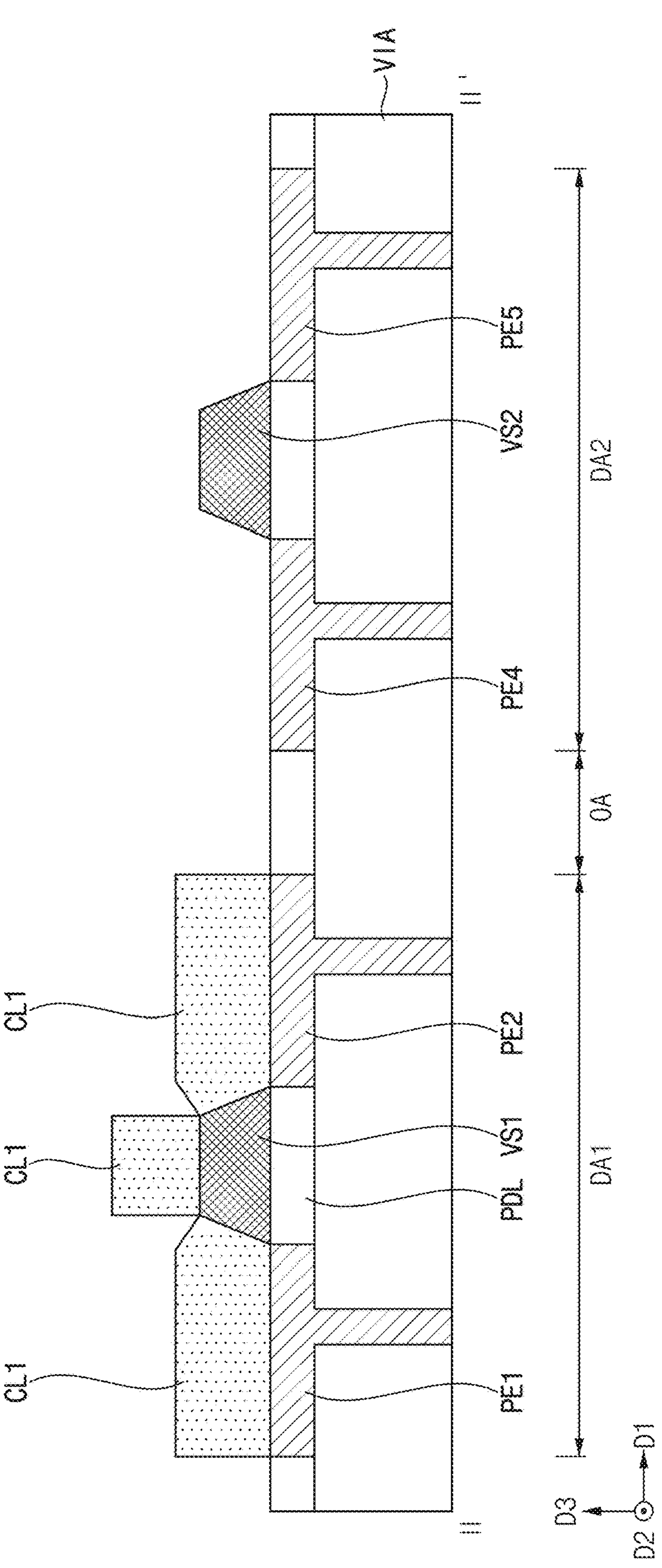

Referring to FIGS. 24, 25, and 26, the first common layer CL1 of the first deposition region DA1 may be formed through a first fine metal mask FMM1. As described above, in the first deposition region DA1, four pixels may be arranged side by side in the second direction D2, and the first fine metal mask FMM1 may be loaded such that a first open portion OP1 of the first fine metal mask FMM1 corresponds in the first deposition region DA1.

Figure 27:
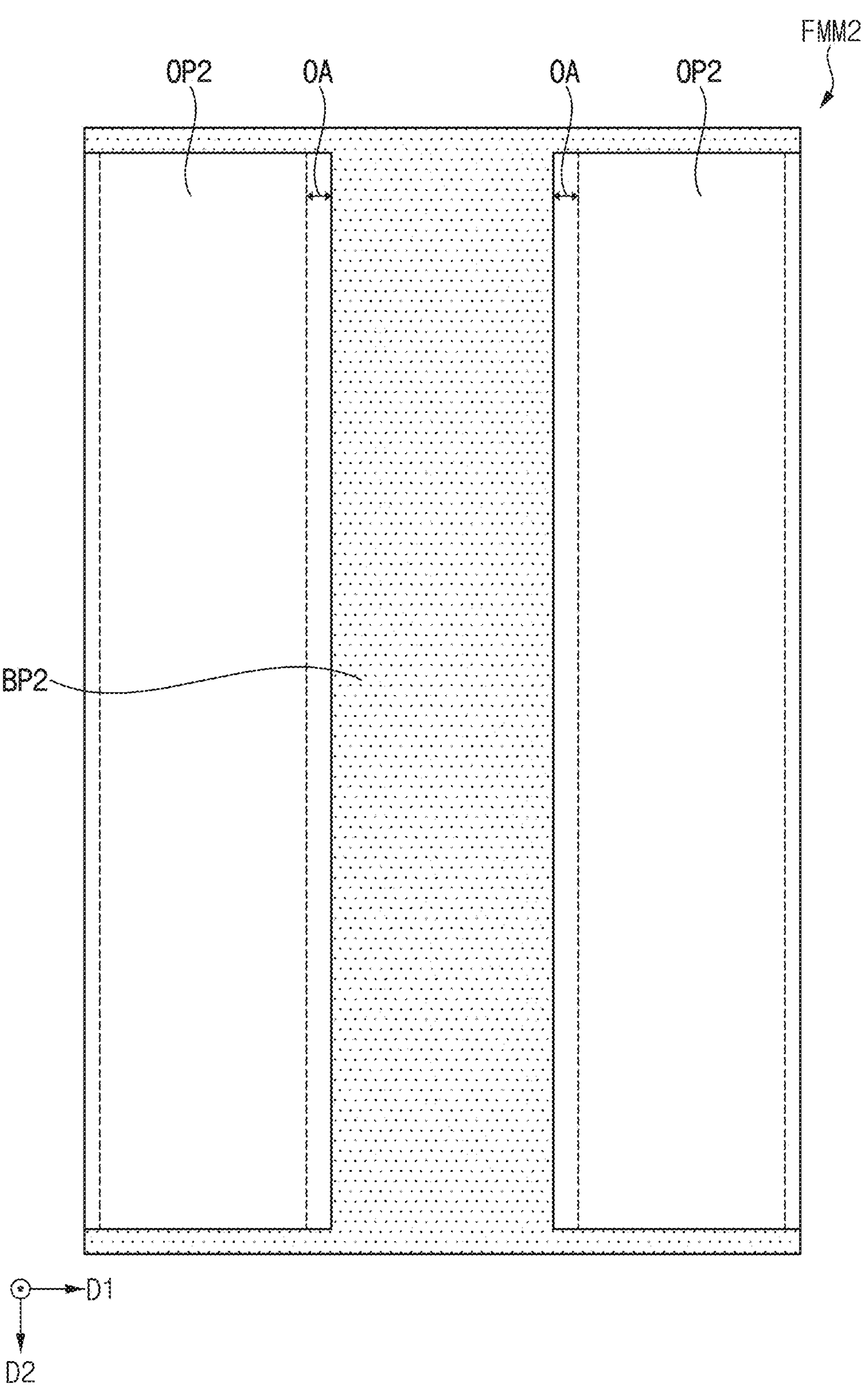
Figure 28:
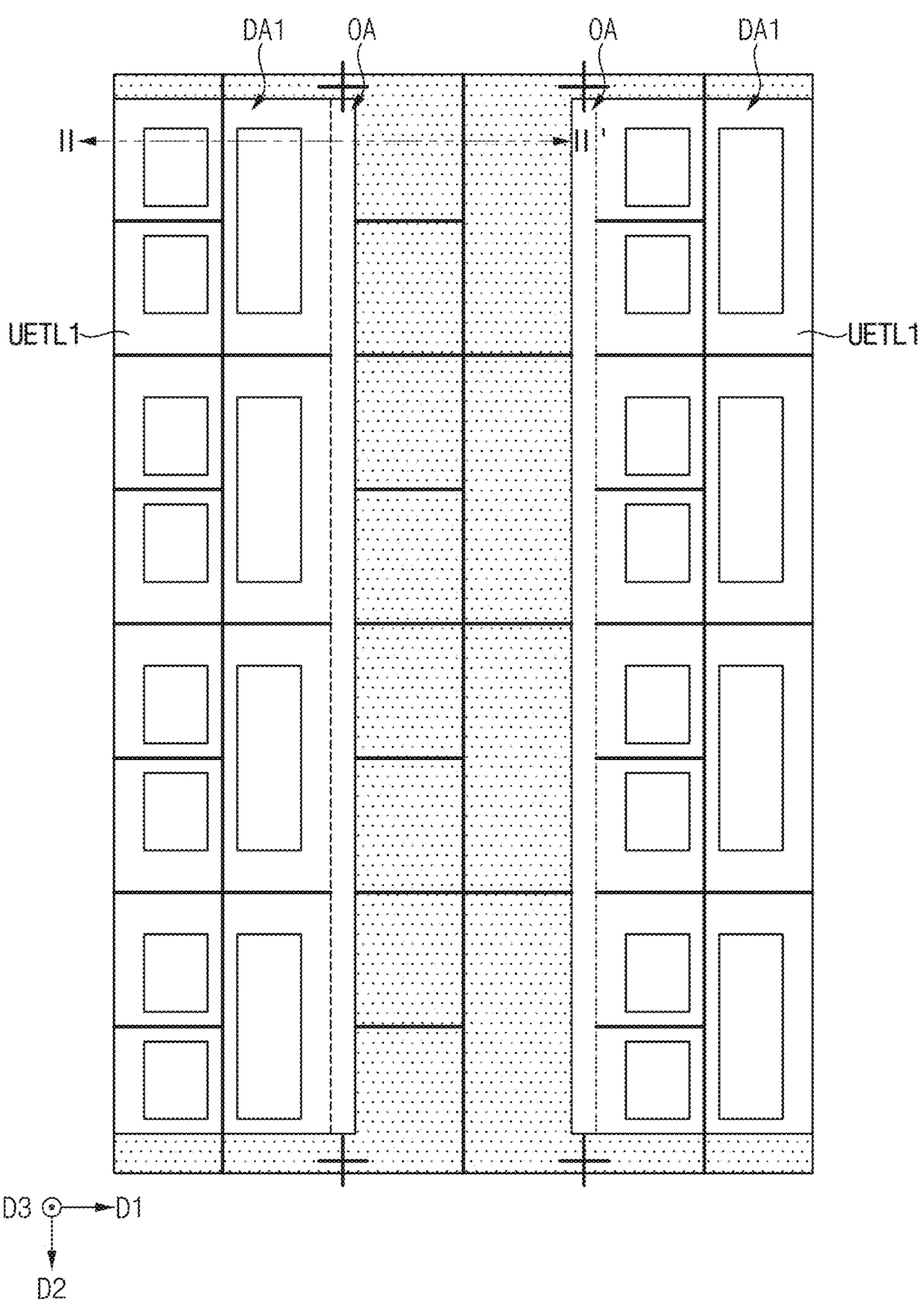
Figure 29:
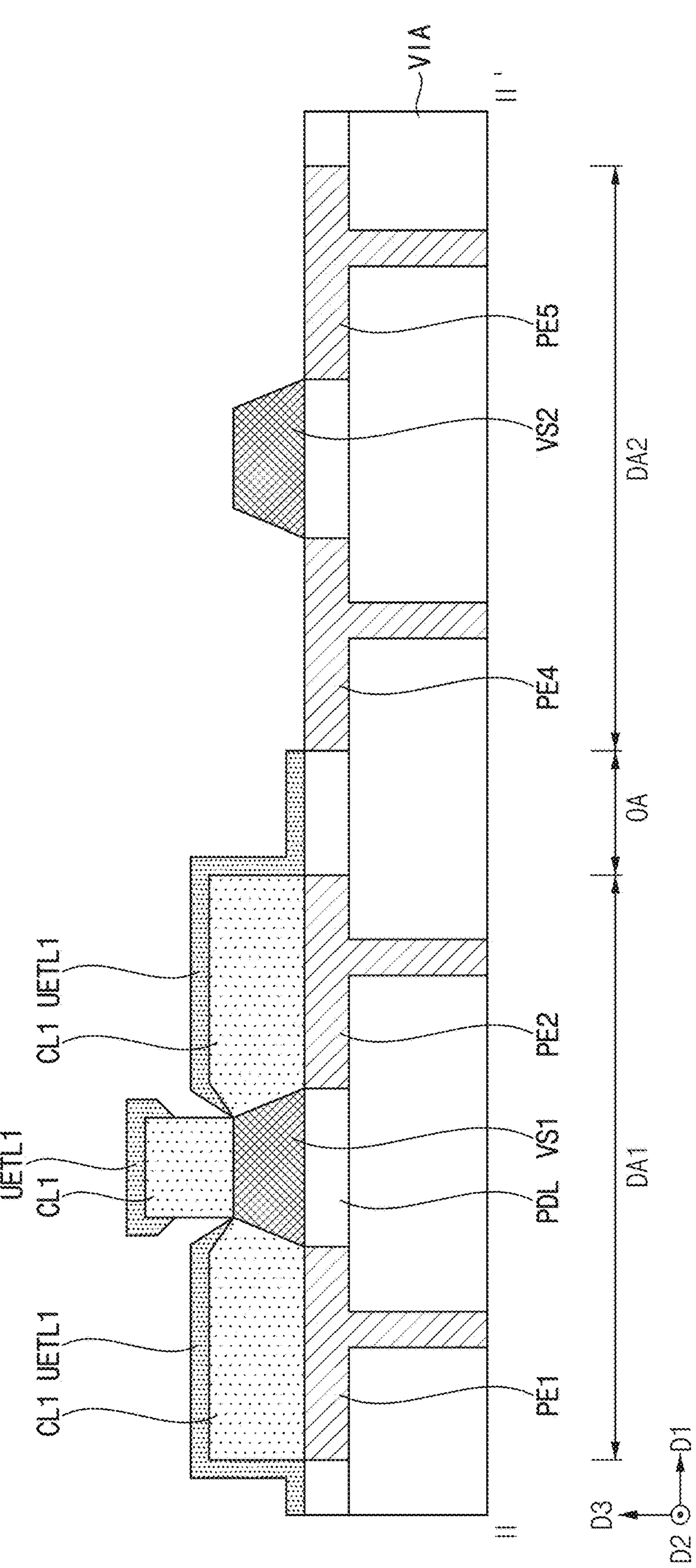

Referring to FIGS. 27, 28, and 29, the first upper electron transport layer UETL1 of the first deposition region DA1 and the overlapping region OA may be formed through a second fine metal mask FMM2. An area of the second open portion OP2 of the second fine metal mask FMM2 may be greater than an area of the first open portion OP1 by about twice of an area of the overlapping region OA in a plan view.

Figure 30:
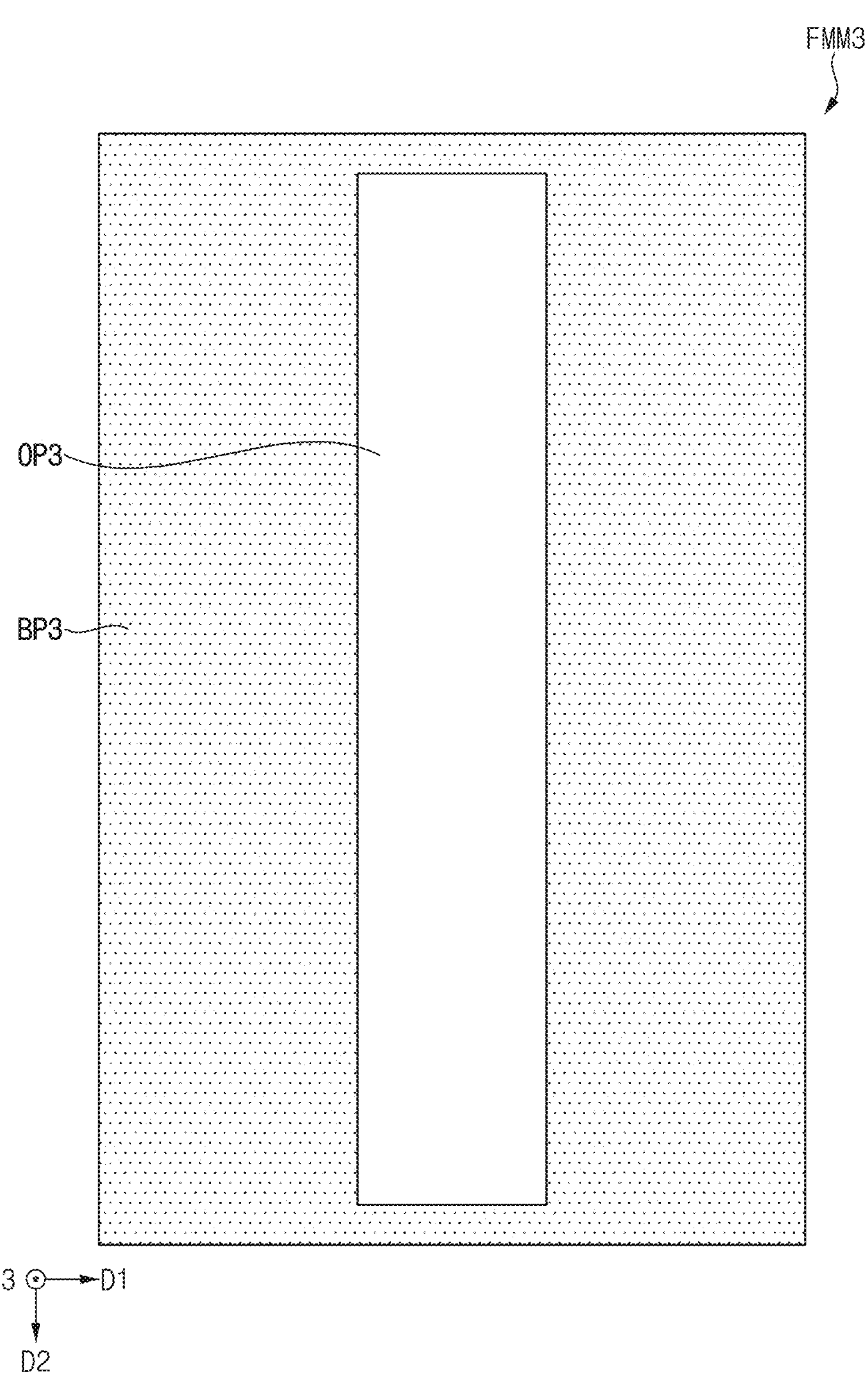
Figure 31:
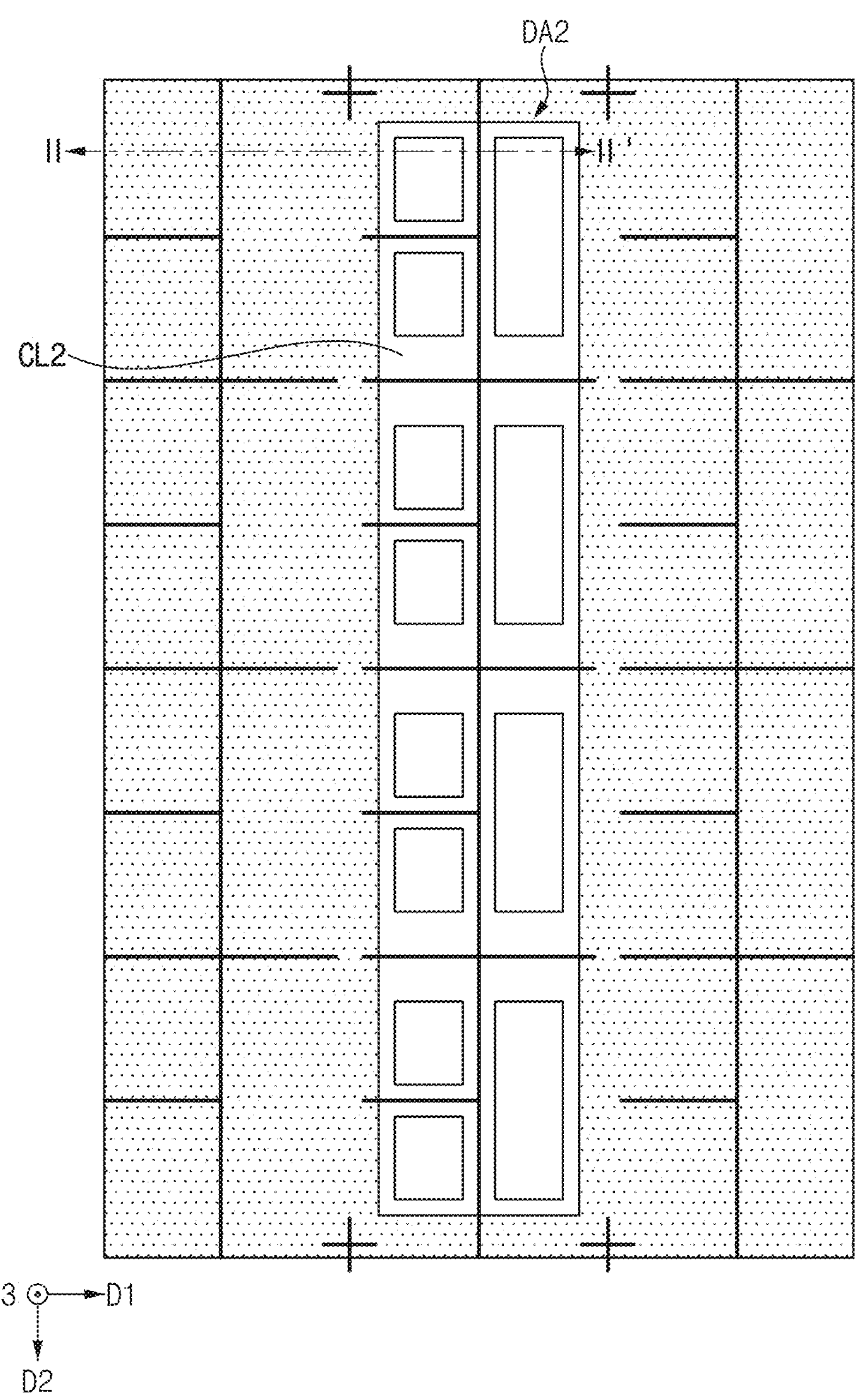
Figure 32:
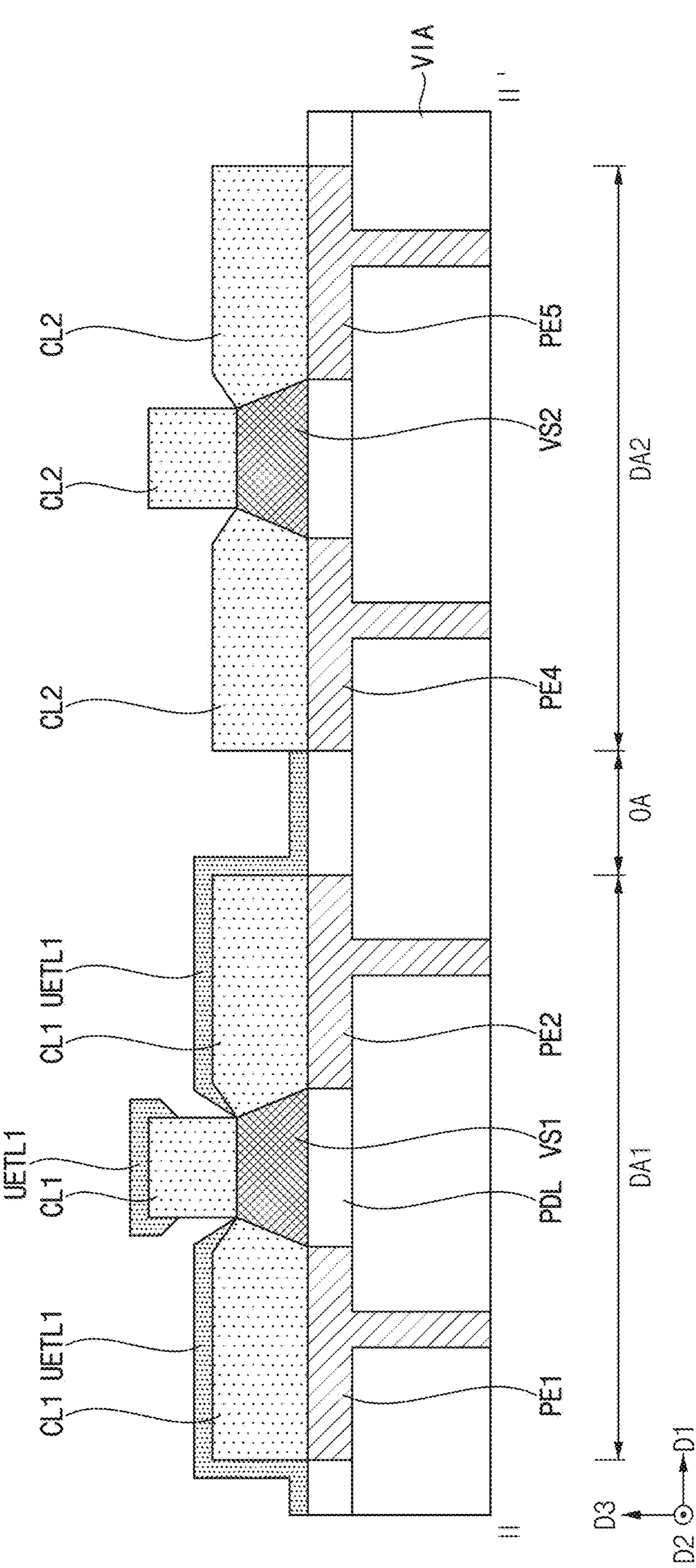

Referring to FIGS. 30, 31, and 32, the second common layer CL2 of the second deposition region DA2 may be formed through a third fine metal mask FMM3. The third fine metal mask FMM3 may be loaded such that the third open portion OP3 of the third fine metal mask FMM3 corresponds to the second deposition region DA2. An area of the third open portion OP3 and an area of the first open portion OP1 may be substantially the same.

Figure 33:
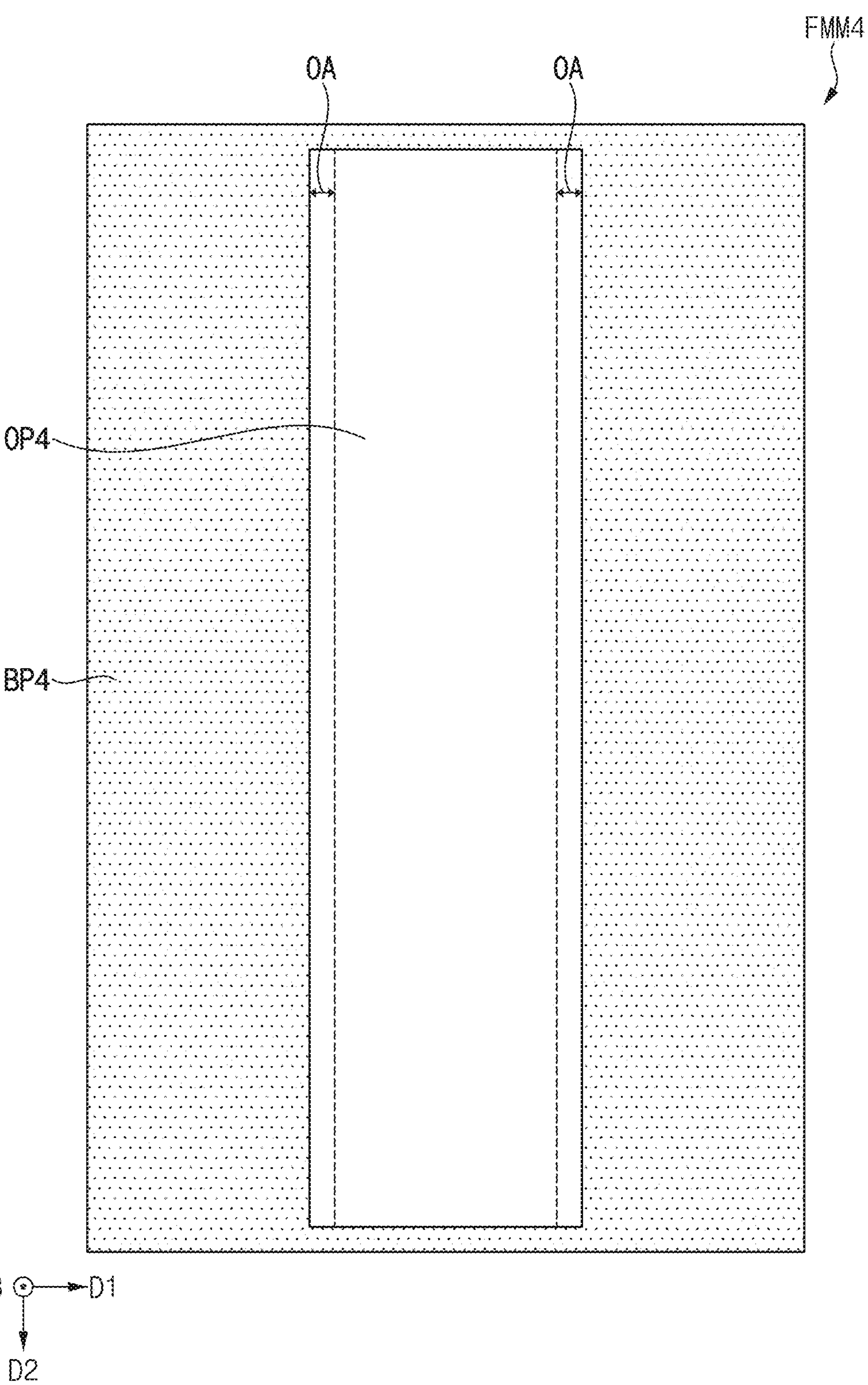
Figure 34:
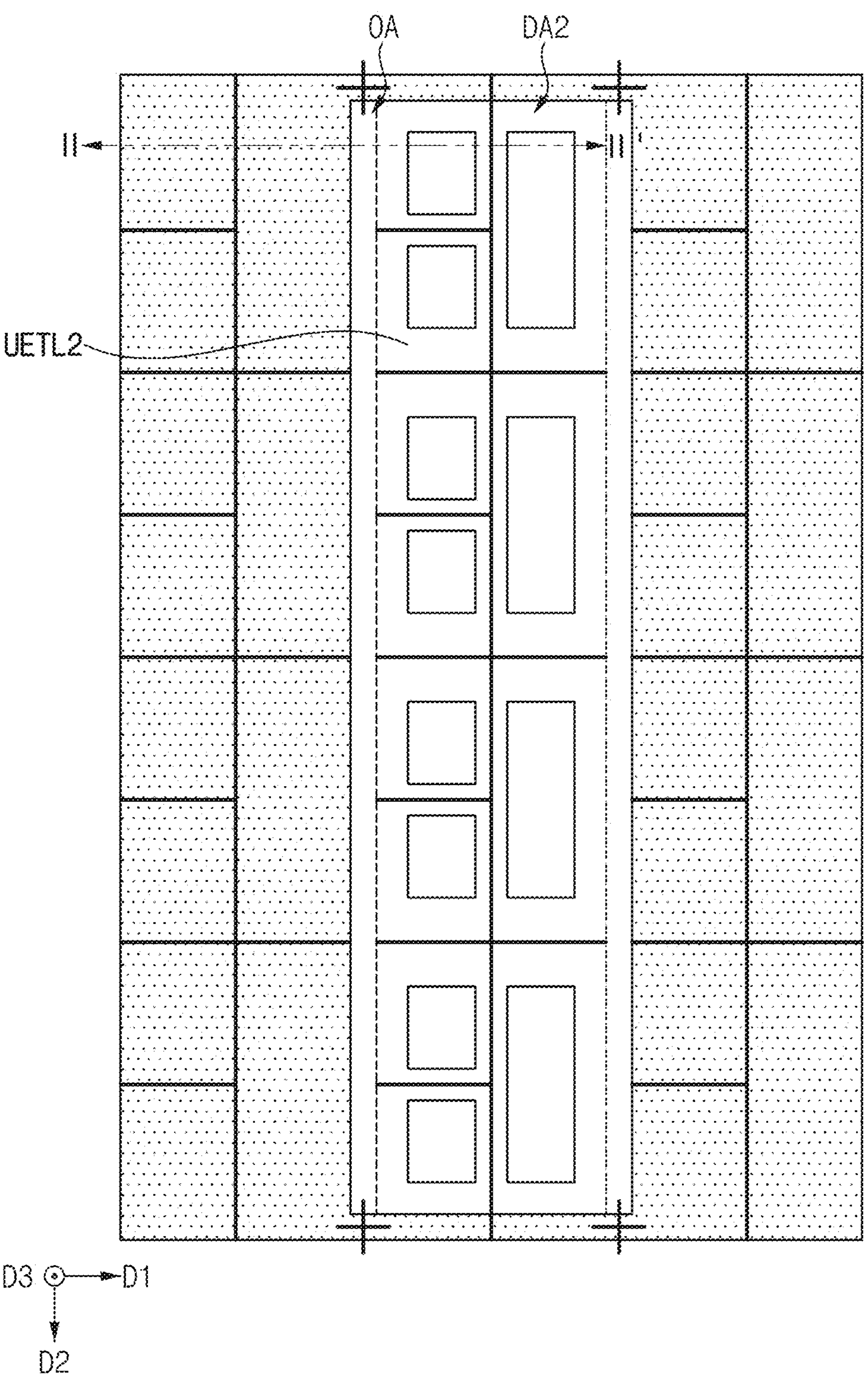
Figure 35:
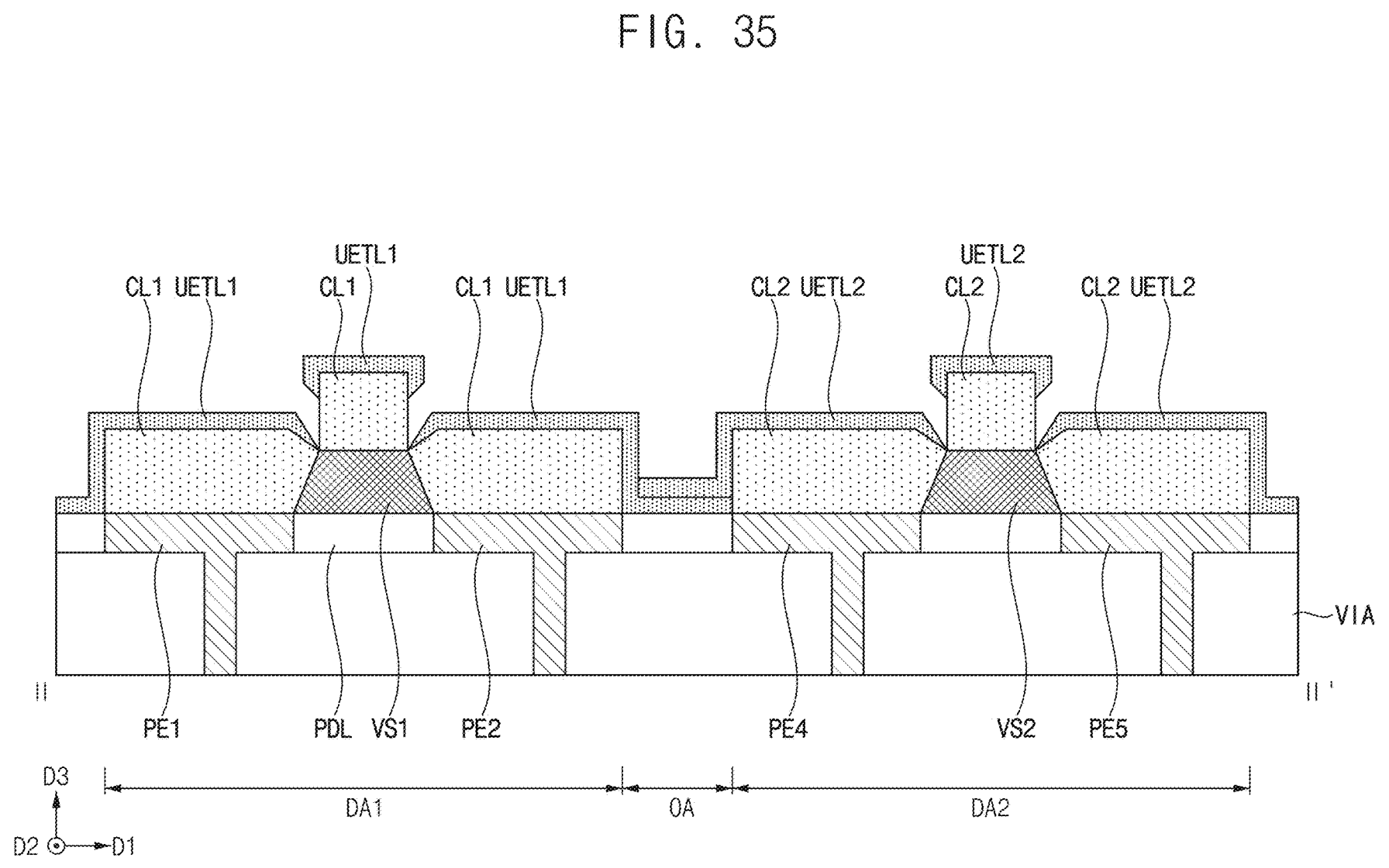

Referring to FIGS. 33, 34, and 35, the second upper electron transport layer UETL2 of the second deposition region DA2 and the overlapping region OA may be formed through a fourth fine metal mask FMM4. An area of the fourth open portion OP4 of the fourth fine metal mask FMM4 may be greater than an area of the third open portion OP3 by about twice of the overlapping region OA in a plan view.

However, the number and arrangement of pixels defined in the first and second deposition regions DA1 and DA2 are not limited to those described above. In an embodiment, as shown in FIGS. 1 to 22, two pixels may be arranged in a 1×2 structure in the first deposition region DA1, and in another embodiment, as shown in FIGS. 23 to 35, four pixels may be arranged in a 1×4 structure in the first deposition area DA1. In another embodiment, pixels may be arranged in a 2×2 structure, a 1×8 structure, a 2×1 structure, or the like in the first deposition region.

Figure 36:
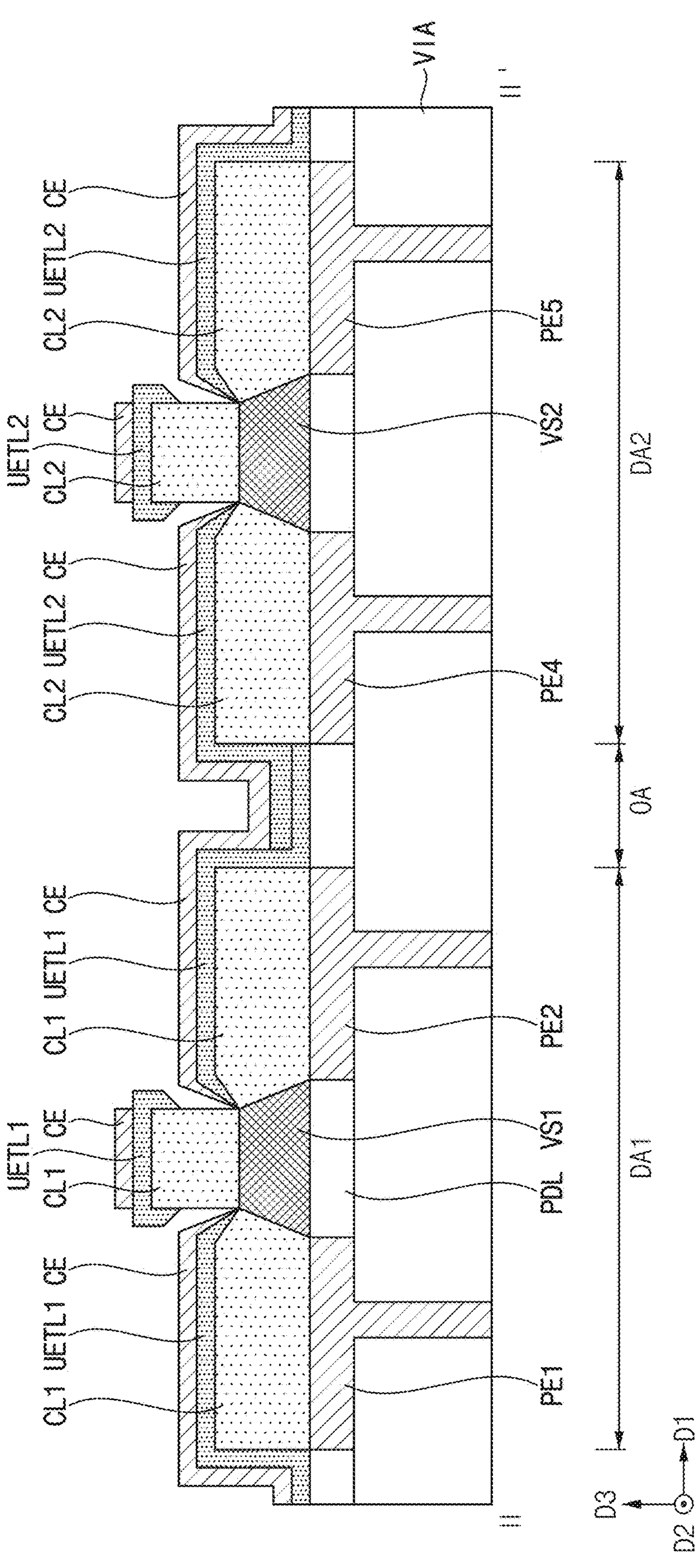

Referring to FIG. 36, the common electrode CE may be formed through an open mask.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a substrate including:

a first deposition region;

a second deposition region adjacent to the first deposition region in a first direction; and an overlapping region disposed between the first deposition region and the second deposition region;

a first vertical separator disposed on the first deposition region of the substrate and extending in a second direction intersecting the first direction;

a first common layer disposed on the first deposition region of the substrate and disconnected by the first vertical separator;

a second common layer disposed on the second deposition region of the substrate and disconnected from the first common layer in the overlapping region; and a common electrode disposed on the first common layer and the second common layer and connected in the overlapping region.

2. The display device of claim 1, further comprising:

a first upper electron transport layer disposed on the first common layer and extending to the overlapping region; and a second upper electron transport layer disposed on the second common layer, extending to the overlapping region, and contacting the first upper electron transport layer in the overlapping region.

3. The display device of claim 1, wherein the first common layer includes:

a first hole transport layer;

a blue emission layer disposed on the first hole transport layer;

a first electron transport layer disposed on the blue emission layer;

a first charge generation layer disposed on the first electron transport layer;

a second hole transport layer disposed on the first charge generation layer;

a red emission layer disposed on the second hole transport layer;

a second charge generation layer disposed on the red emission layer;

a third hole transport layer disposed on the second charge generation layer; and a green emission layer disposed on the third hole transport layer.

4. The display device of claim 1, wherein a first pixel and a second pixel adjacent to the first pixel in the second direction are disposed in the first deposition region, and the first pixel includes:

a first pixel electrode;

a second pixel electrode adjacent to the first pixel electrode in the first direction with the first vertical separator interposed between the first pixel electrode and the second pixel electrode; and a third pixel electrode adjacent to the first pixel electrode in the second direction.

5. The display device of claim 4, further comprising:

a first horizontal separator disposed between the first pixel and the second pixel, and extending in the first direction; and a second horizontal separator disposed between the first pixel electrode and the third pixel electrode, and extending in the first direction.

6. The display device of claim 1, wherein no separator is disposed in the overlapping region.

7. The display device of claim 1, wherein a first pixel, a second pixel adjacent to the first pixel in the second direction, a third pixel adjacent to the second pixel in the second direction, and a fourth pixel adjacent to the third pixel in the second direction are disposed in the first deposition region.

8. The display device of claim 7, further comprising:

horizontal separators disposed between the first to fourth pixels and extending in the first direction.

9. A method of manufacturing a display device, the method comprising:

forming a first vertical separator on a first deposition region of a substrate, the substrate including the first deposition region, a second deposition region adjacent to the first deposition region in a first direction, and an overlapping region disposed between the first deposition region and the second deposition region;

forming a first common layer on the first deposition region of the substrate, the first common layer disconnected by the first vertical separator;

forming a second common layer on the second deposition region of the substrate, the second common layer disconnected from the first common layer in the overlapping region; and forming a common electrode on the first common layer and the second common layer, the common electrode connected in the overlapping region.

10. The method of claim 9, further comprising:

forming a first upper electron transport layer on the first common layer extending to the overlapping region; and forming a second upper electron transport layer on the second common layer extending to the overlapping region, wherein the second upper electron transport layer contacts the first upper electron transport layer in the overlapping region.

11. The method of claim 10, wherein the first common layer, the first upper electron transport layer, the second common layer, and the second upper electron transport layer are sequentially formed.

12. The method of claim 11, wherein the first common layer is formed through a first fine metal mask, and the first upper electron transport layer is formed through a second fine metal mask.

13. The method of claim 12, wherein a width of an open portion of the second fine metal mask is greater than a width of an open portion of the first fine metal mask by twice of a width of the overlapping region, in the first direction.

14. The method of claim 12, wherein the second common layer is formed through a third fine metal mask, and the second upper electron transport layer is formed through a fourth fine metal mask.

15. The method of claim 14, wherein an area of an open portion of the third fine metal mask and an area of an open portion of the first fine metal mask are substantially same in a plan view, and an area of an open portion of the fourth fine metal mask and an area of an open portion of the second fine metal mask are substantially same in a plan view.

16. The method of claim 14, wherein the second fine metal mask and the fourth fine metal mask are loaded such that an open portion of the second fine metal mask and an open portion of the fourth fine metal mask overlap each other in the overlapping region in a plan view.

17. The method of claim 9, wherein the common electrode is formed through an open mask.

18. The method of claim 9, further comprising:

forming a first pixel in the first deposition region by forming a first pixel electrode, a second pixel electrode adjacent to the first pixel electrode in the first direction with the first vertical separator interposed between the first pixel electrode and the second pixel electrode, and a third pixel electrode adjacent to the first pixel electrode in a second direction intersecting the first direction; and forming a second pixel adjacent to the first pixel in the second direction in the first deposition region.

19. The method of claim 18, further comprising:

forming a first horizontal separator between the first pixel and the second pixel; and forming a second horizontal separator between the first pixel electrode and the third pixel electrode.

20. The method of claim 9, wherein no separator is formed in the overlapping region.

* * * * *